US011035707B2

(12) United States Patent
Cooksey et al.

(10) Patent No.: US 11,035,707 B2
(45) Date of Patent: Jun. 15, 2021

(54) OPTICAL FLOW METER FOR DETERMINING A FLOW RATE OF A LIQUID

(71) Applicant: Government of the United States of America, as represented by the Secretary of Commerce, Gaithersburg, MD (US)

(72) Inventors: Gregory Alan Cooksey, Gaithersburg, MD (US); Paul Nathan Patrone, Silver Spring, MD (US); Anthony Jose Kearsley, Hanover, MD (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 446 days.

(21) Appl. No.: 15/967,966

(22) Filed: May 1, 2018

(65) Prior Publication Data
US 2019/0120673 A1    Apr. 25, 2019

Related U.S. Application Data

(60) Provisional application No. 62/576,709, filed on Oct. 25, 2017.

(51) Int. Cl.
*G01S 1/66* (2006.01)
*G01F 1/66* (2006.01)
(Continued)

(52) U.S. Cl.
CPC .............. *G01F 1/661* (2013.01); *C23C 16/00* (2013.01); *G01F 1/704* (2013.01); *G01P 5/26* (2013.01); *G05D 7/00* (2013.01)

(58) Field of Classification Search
CPC .... G01N 21/6428; G01N 21/53; G01N 15/14; G01N 21/645; G01N 15/1459;
(Continued)

(56) References Cited

U.S. PATENT DOCUMENTS

| 2005/0068536 | A1* | 3/2005 | Schwabe | ............ G01N 21/6428 356/436 |
| 2013/0004987 | A1* | 1/2013 | Lo | ..................... B01L 3/502715 435/34 |

OTHER PUBLICATIONS

D. Ross, et al., "Imaging of electroosmotic flow in plastic microchannels", Anal. Chem., 2001, p. 2509-2515, 73.
(Continued)

*Primary Examiner* — Luke D Ratcliffe
(74) *Attorney, Agent, or Firm* — Office of Chief Counsel for National Institute of Standards and Technology

(57) ABSTRACT

An optical flow meter includes a substrate; a microchannel with a fluid receiver; a fluid transmitter; a fluid member with an optical interaction region; a photo interaction region; an analytical light path, such that analytical light interacts with an analyte in a photo interaction region subsequent to an interaction of a pre-analyte with activation light in an optical interaction region to produce analyte; and a detection light path disposed in the substrate, arranged at an oblique angle or right angle to the fluid member proximate to the photo interaction region, and that: receives the photoanalyte light from the photo interaction region; and communicates the photoanalyte light from the microchannel to a photodetector, the optical flow meter determines a flow rate of the analyte.

23 Claims, 32 Drawing Sheets

(51) Int. Cl.
    *G01F 1/704*     (2006.01)
    *C23C 16/00*     (2006.01)
    *G01P 5/26*     (2006.01)
    *G05D 7/00*     (2006.01)

(58) Field of Classification Search
    CPC ......... B01L 3/502776; B01L 3/502715; B01L 2200/0636
    See application file for complete search history.

(56) References Cited

OTHER PUBLICATIONS

M. Ahrens, et al., "Design and uncertainty assessment of a setup for calibration of microfluidic devices down to 5nL min-1", Measurement and Science Technology, 2014, p. 1-9, 25.

M. Ahrens, et al., "An experimental setup for traceable measurement and calibration of liquid flow rates down to 5 nL/min", Biomed. Eng.-Biomed. Tech., 2015, p. 337-345, 60(4).

H. Hosseinkhannazer, et al., "Two-species microparticle detection in optofluidic biochips with polymeric waveguides", Proceedings of SPIE: Photonics North 2008, 2008, vol. 7099.

V. Lien, et al., "Microfluidic flow rate detection cased on integrated optical fiber canitlever", The Royal Society of Chemistry: Lab on a Chip, 2007, p. 1352-1356, 7.

E. Pedrol, et al., "Optofluidic device for the quantification of circulating tumor cells in breast cancer", Nature: Scientific Reports, 2017.

\* cited by examiner

OPTICAL FLOW METER FOR DETERMINING A FLOW RATE OF A LIQUID

CROSS REFERENCE TO RELATED APPLICATIONS

This application claims the benefit of U.S. Provisional Patent Application Ser. No. 62/576,709 filed Oct. 25, 2017, the disclosure of which is incorporated herein by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 301-975-2573; email tpo@nist.gov; reference.

BRIEF DESCRIPTION

Disclosed is an optical flow meter comprising: a substrate; a microchannel disposed in the substrate comprising: a fluid receiver that receives a liquid comprising an analyte; a fluid transmitter that receives the liquid from the fluid receiver; and a fluid member interposed between the fluid receiver and fluid transmitter and that: comprises: an optional optical interaction region and that receives activation light; and a photo interaction region and that: receives analytical light; and communicates photoanalyte light out of the fluid member; is bounded by the substrate; and communicates the liquid from the fluid receiver to the fluid transmitter; an optional activation light path disposed in the substrate, arranged at an oblique angle or right angle to the fluid member proximate to the optical interaction region, and that: receives activation light from an activation light source; and communicates the activation light to the optical interaction region, such that the activation light interacts with the pre-analyte in the optical interaction region to produce an analyte; an analytical light path disposed in the substrate, arranged at an oblique angle or right angle to the fluid member proximate to the photo interaction region, and that: receives the analytical light from an analytical light source; and communicates the analytical light to the photo interaction region, such that the analytical light: interacts with the analyte in the photo interaction region subsequent to the interaction of the analyte with the activation light in the optical interaction region; and produces a photoanalyte from the analyte in response to interaction of the analyte with the analytical light in the photo interaction region, the photoanalyte producing photoanalyte light; and a detection light path disposed in the substrate, arranged at an oblique angle or right angle to the fluid member proximate to the photo interaction region, and that: receives the photoanalyte light from the photo interaction region; and communicates the photoanalyte light from the microchannel to a photodetector, the optical flow meter determines a flow rate of the analyte that is from 0.1 nanoliter per minute (nL/min) to 5 mL/min.

Also disclosed is a process for determining a flow rate of a liquid, with the optical flow meter, the process comprising: flowing the liquid comprising an analyte through the microchannel; communicating analytical light through the analytical light path to the photo interaction region; subjecting the analyte to the analytical light; producing a photoanalyte from the analyte in response to subjecting the analyte to the analytical light; producing photoanalyte light from the photoanalyte; communicating the photoanalyte light from the photo interaction region to the detection light path to determine the flow rate of the liquid.

Further disclosed is a process for determining a flow rate of a liquid, with the optical flow meter, the process comprising: flowing the liquid comprising an analyte through the microchannel; communicating activation light through the activation light path to the optical interaction region; subjecting the pre-analyte to the activation light; exciting the pre-analyte with the activation light to produce analyte; communicating, in the fluid member, the analyte from the optical interaction region to the photo interaction region; communicating analytical light through the analytical light path to the photo interaction region; subjecting the activated analyte to the analytical light; producing a photoanalyte from the activated analyte in response to subjecting the analyte to the analytical light; producing photoanalyte light from the photoanalyte; communicating the photoanalyte light from the photo interaction region to the detection light path to determine the flow rate of the liquid.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
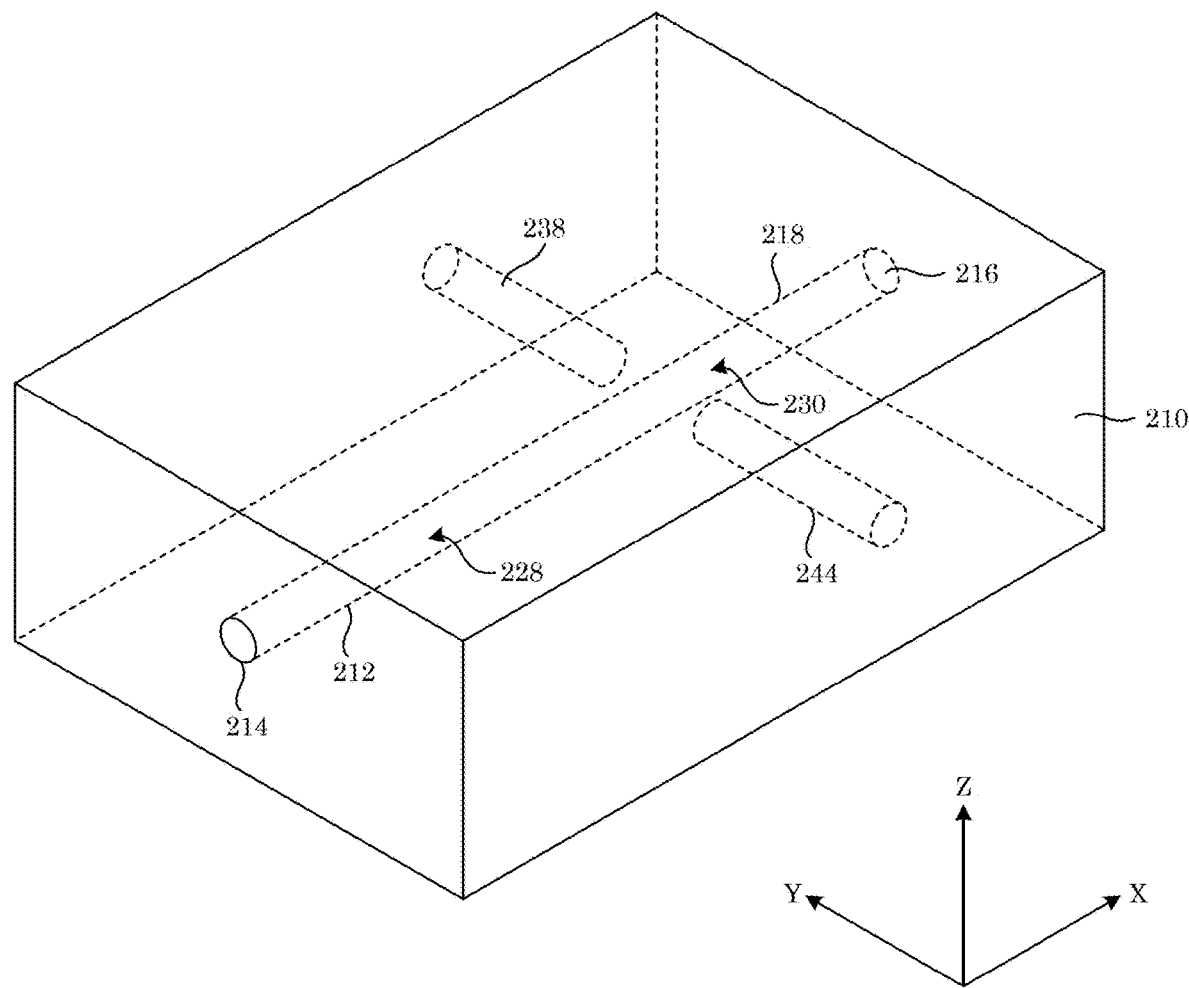
FIG. 1 shows a perspective view of an optical flow meter.
Figure 2:
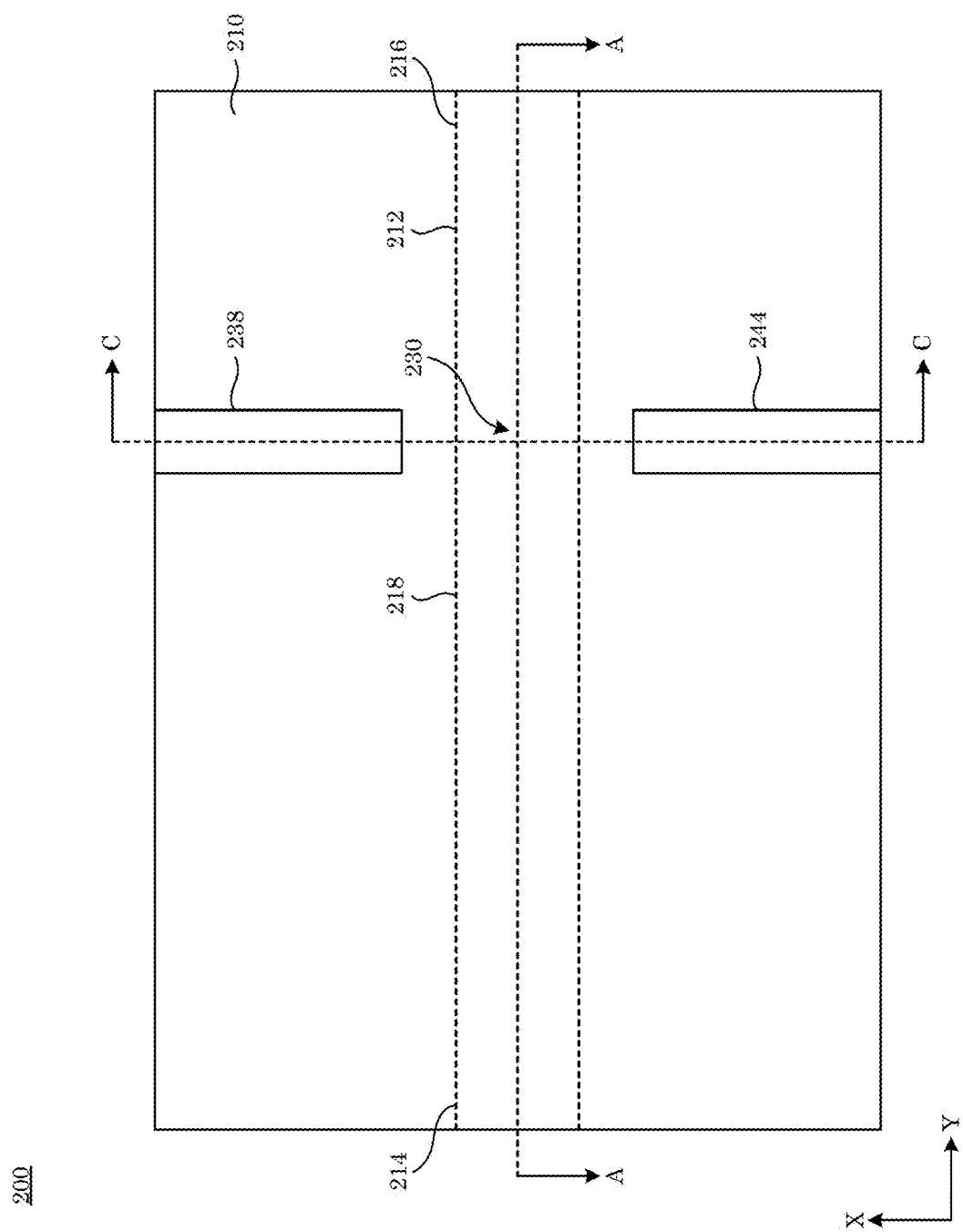
FIG. 2 shows a top view of the optical flow meter shown in FIG. 1.
Figure 3:
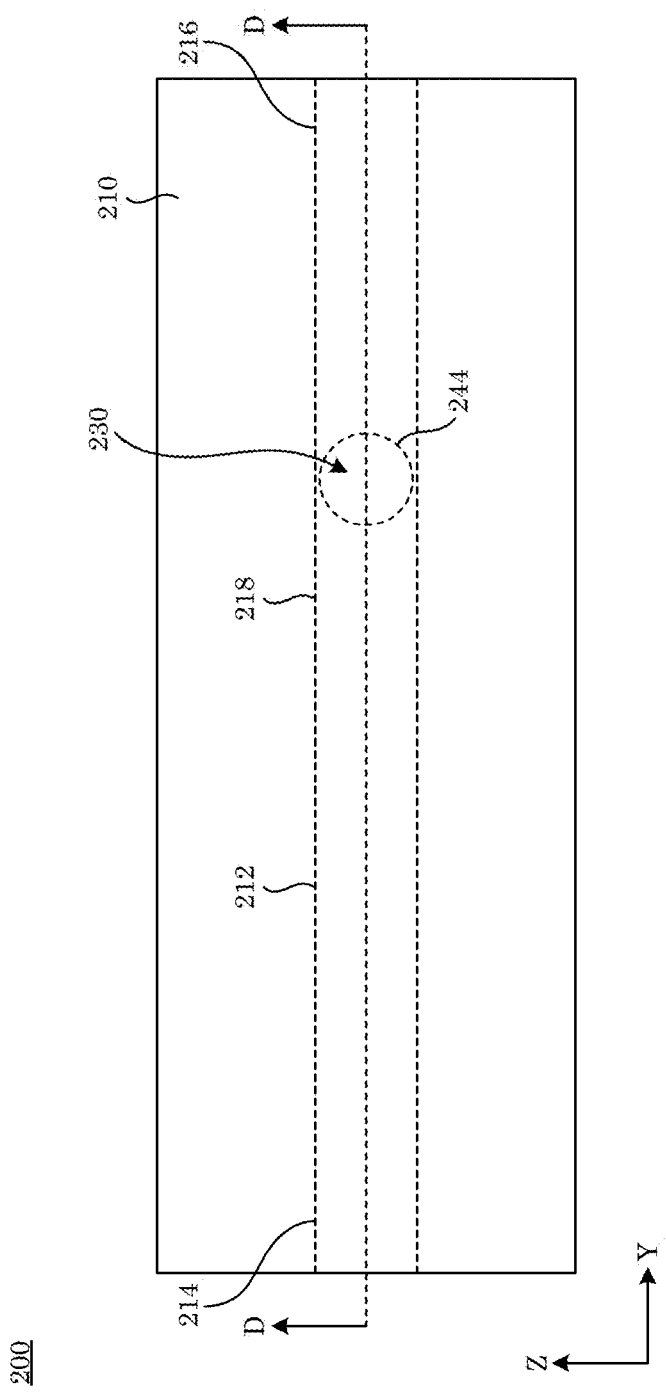
FIG. 3 shows a side view of the optical flow meter shown in FIG. 1.
Figure 4:
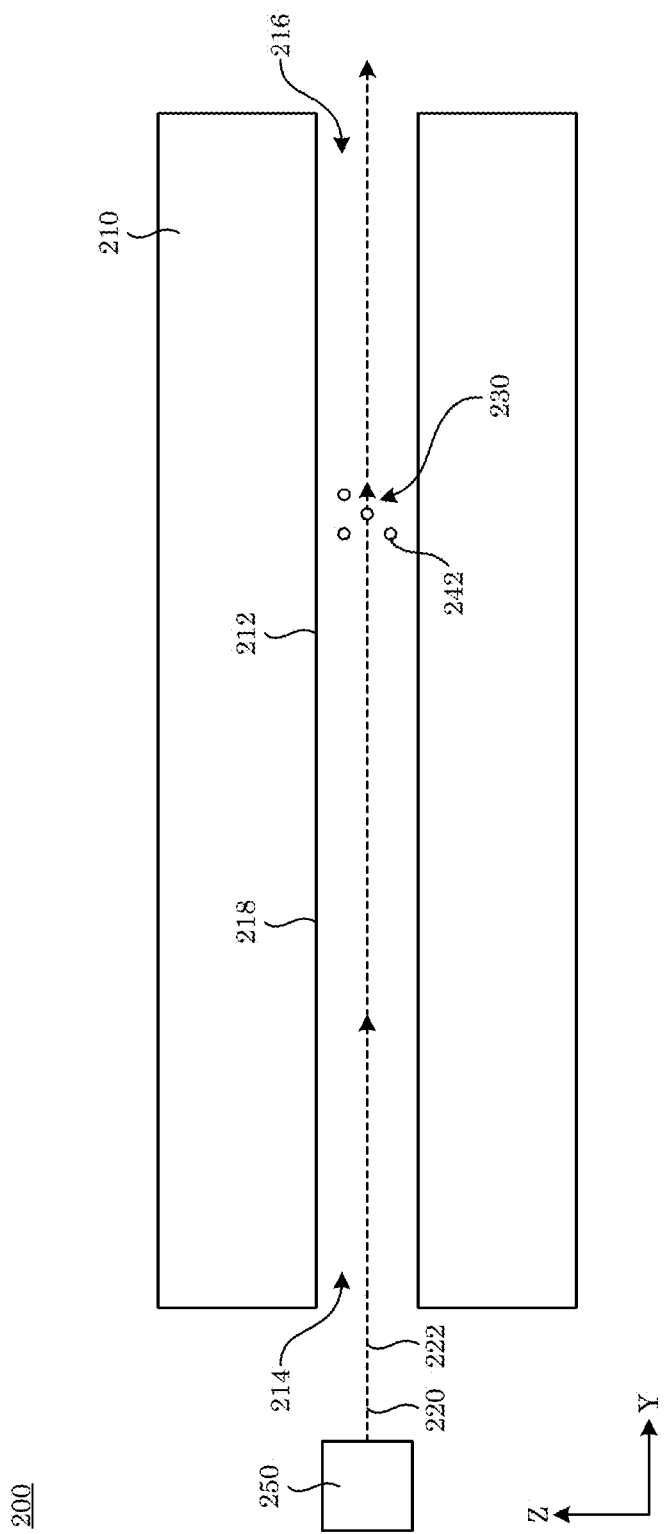
FIG. 4 shows a cross-section along line A-A of the optical flow meter shown in FIG. 2.
Figure 5:
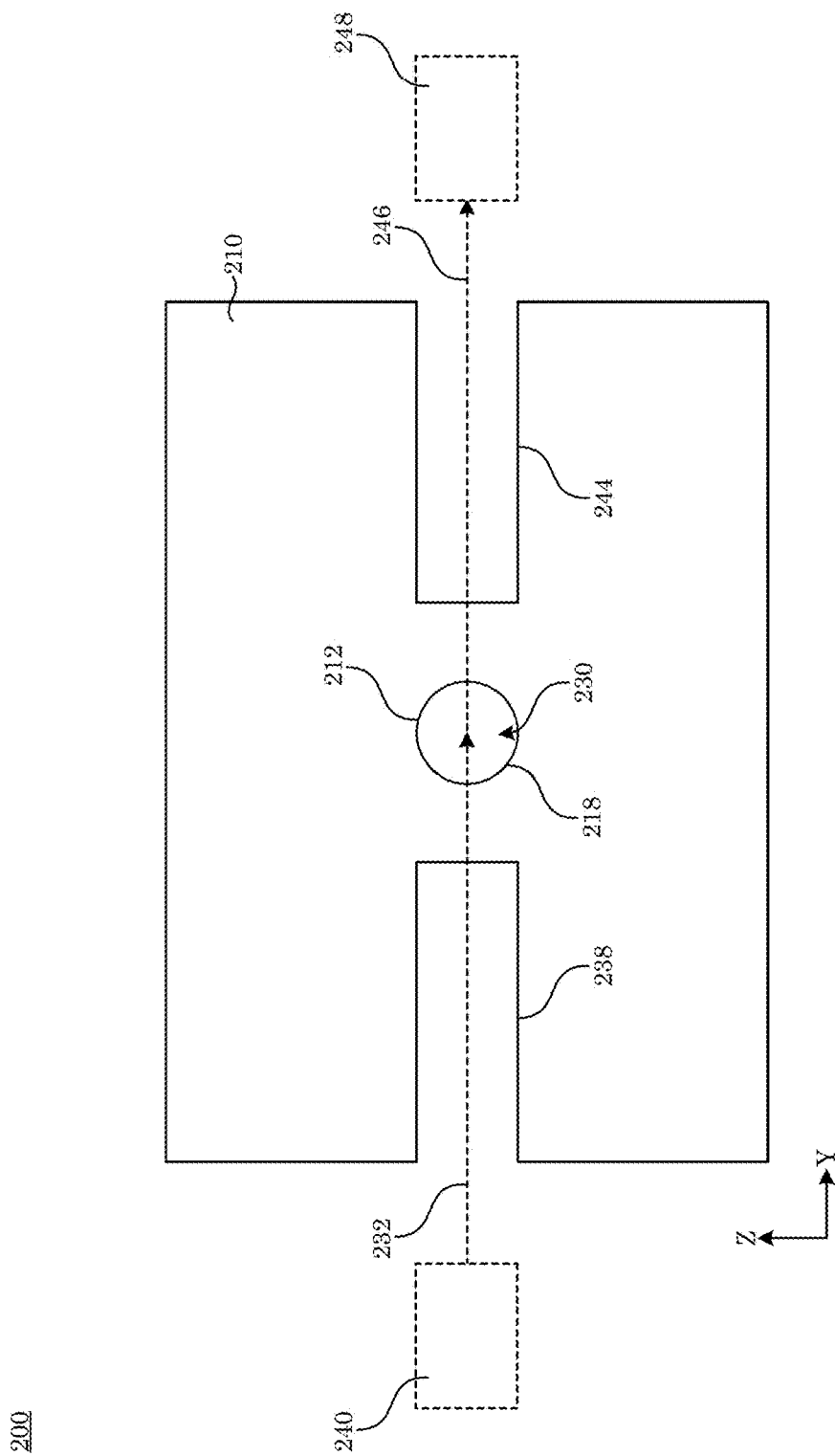
FIG. 5 shows a cross-section along line C-C of the optical flow meter shown in FIG. 2.
Figure 6:
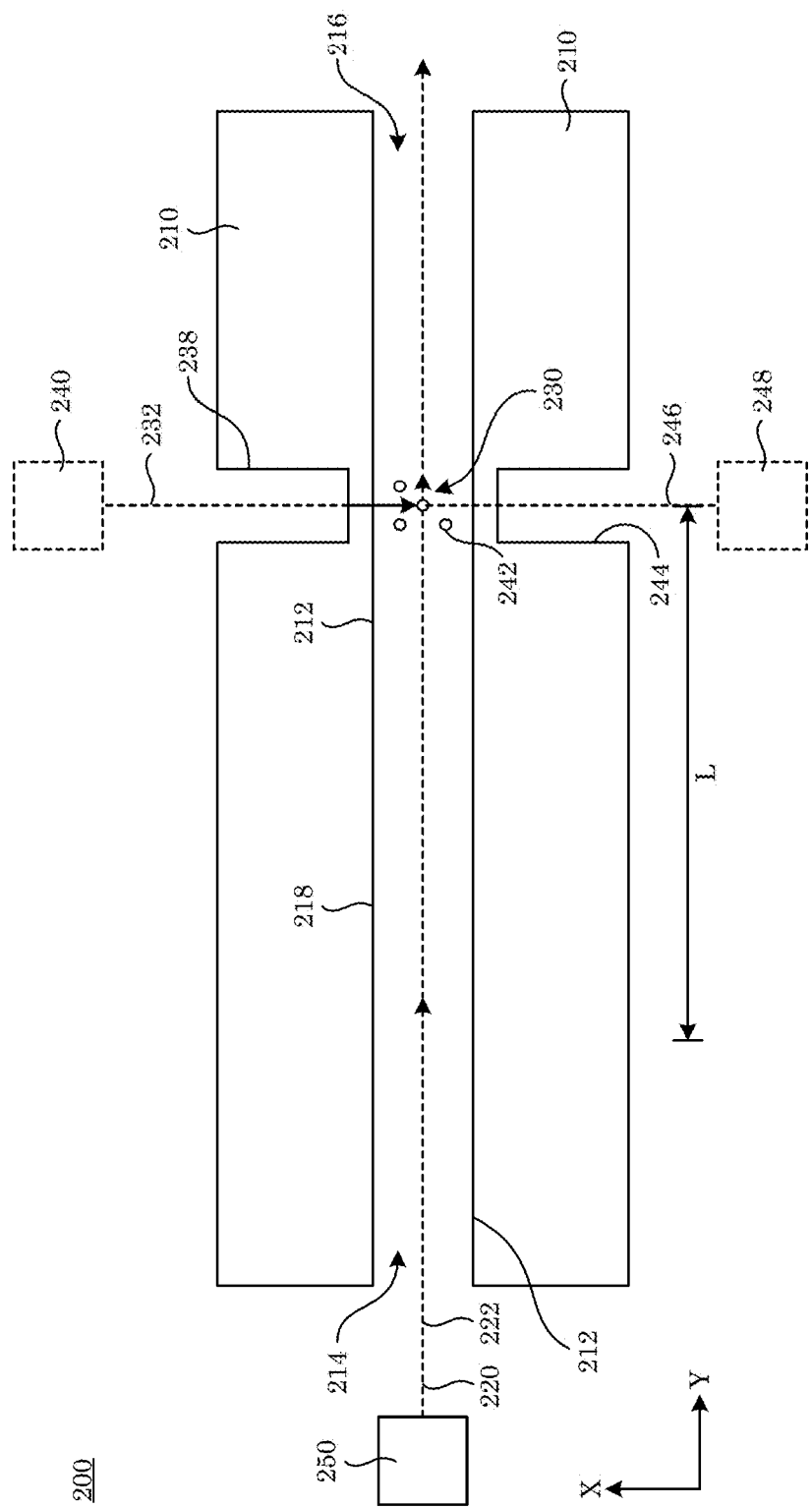
FIG. 6 shows a cross-section along line D-D of the optical flow meter shown in FIG. 3.

A detailed description of one or more embodiments is presented herein by way of exemplification and not limitation.

It has been discovered that an optical flow meter and a process for determining a flow rate of a liquid unexpectedly and advantageously provide a determination of convection or diffusion of a liquid, e.g., a liquid that includes a contrast agent (analyte) (e.g., a fluorescent marker) at a measurement point located within a photo interaction region, wherein the liquid flows in a microchannel of the optical flow meter. Further, a pre-contrast agent (pre-analyte) can be converted to a contrast agent at an activation region upstream of a measurement point. Beneficially, the optical flow meter can be integrated in a microfluidic system and can be part of flow control, chemical analysis, particle or cell measurement system, and the like.

The optical flow meter is part of the NIST on a Chip program, which is creating portable, SI-traceable measurement devices that can be used directly on factory floors, in hospital diagnostic centers, and the like. These NIST-pioneered technologies will be manufactured and distributed by the private sector, opening new tech-transfer and lab-to-market opportunities in accordance with NIST's goal of strengthening U.S. economic competitiveness by supporting advanced manufacturing. In the optical flow meter, volumetric flow and flow velocity are traceable to a dimension of microchannels and waveguide spacing (meter) and timing of light activation pulses and power measurements (second). Compared to conventional devices based on convection or diffusion to visualize or measure microflows, the optical flow meter can be used in an absence of a microscope or computation of tracer displacements in a field (e.g., microparticle velocimetry). Moreover, determination of flow rate with the optical flow meter is continuously monitored by recording the amount of light given off by a contrast agent with respect to a maximum amount of light or repeated by controlling the activation light (e.g., by pulsing the power or using a waveform) and measuring the time-of-flight or swept volume from the activation to a measurement point. Optical waveguides can be hard-wired onto a chip such that operation of the optical flow meter is independent of laser positioning, focusing, or alignment of the laser and laser light.

In an embodiment, with reference to FIG. 1, FIG. 2, FIG. 3, FIG. 4, FIG. 5, and FIG. 6, optical flow meter 200 includes substrate 210 and microchannel 212 disposed in substrate 210. Microchannel 212 includes fluid receiver 214 that receives liquid 220 including analyte 222; fluid transmitter 216 that receives liquid 220 from fluid receiver 214; and fluid member 218 interposed between fluid receiver 214 and fluid transmitter 218. Fluid member 218 includes photo interaction region 230. Photo interaction region 230 receives analytical light 232 and communicates photoanalyte light 246 out of fluid member 218. Microchannel 212 is bounded by substrate 210. Further, fluid member 218 communicates liquid 220 from fluid receiver 214 to fluid transmitter 216. Additionally, optical flow meter 200 includes analytical light path 238 disposed in substrate 210 and arranged at an oblique angle or right angle to fluid member 218 proximate to photo interaction region 230. Analytical light path 238 receives analytical light 232 from analytical light source 240 and communicates analytical light 232 to photo interaction region 230, wherein analytical light 232 interacts with analyte 222 in photo interaction region 230 and produces photoanalyte 242 from analyte 222 in response to interaction of analyte 222 with analytical light 232 in photo interaction region 230. Photoanalyte 242 produces photoanalyte light 246 that is communicated through detection light path 244 disposed in substrate 210. Detection light path 244 is arranged at an oblique angle or right angle to fluid member 218 proximate to photo interaction region 230 and receives photoanalyte light 246 from photo interaction region 230 and communicates photoanalyte light 246 from microchannel 212 to photodetector 248.

Optical flow meter 200 can include flow controller 250 that provides liquid 220 to fluid receiver 214. Further, analytical light source 240 can be in optical communication with analytical light path 238 and can provide analytical light 232 to analytical light path 238.

In an embodiment, optical flow meter 200 includes photodetector 248 in optical communication with detection light path 244 and that receives photoanalyte light 246 from detection light path 244. Moreover, analytical light source 240 can be included in optical flow meter 200, wherein analytical light source 240 is in optical communication with analytical light path 238 and provides analytical light 232 to analytical light path 238.

Figure 7:
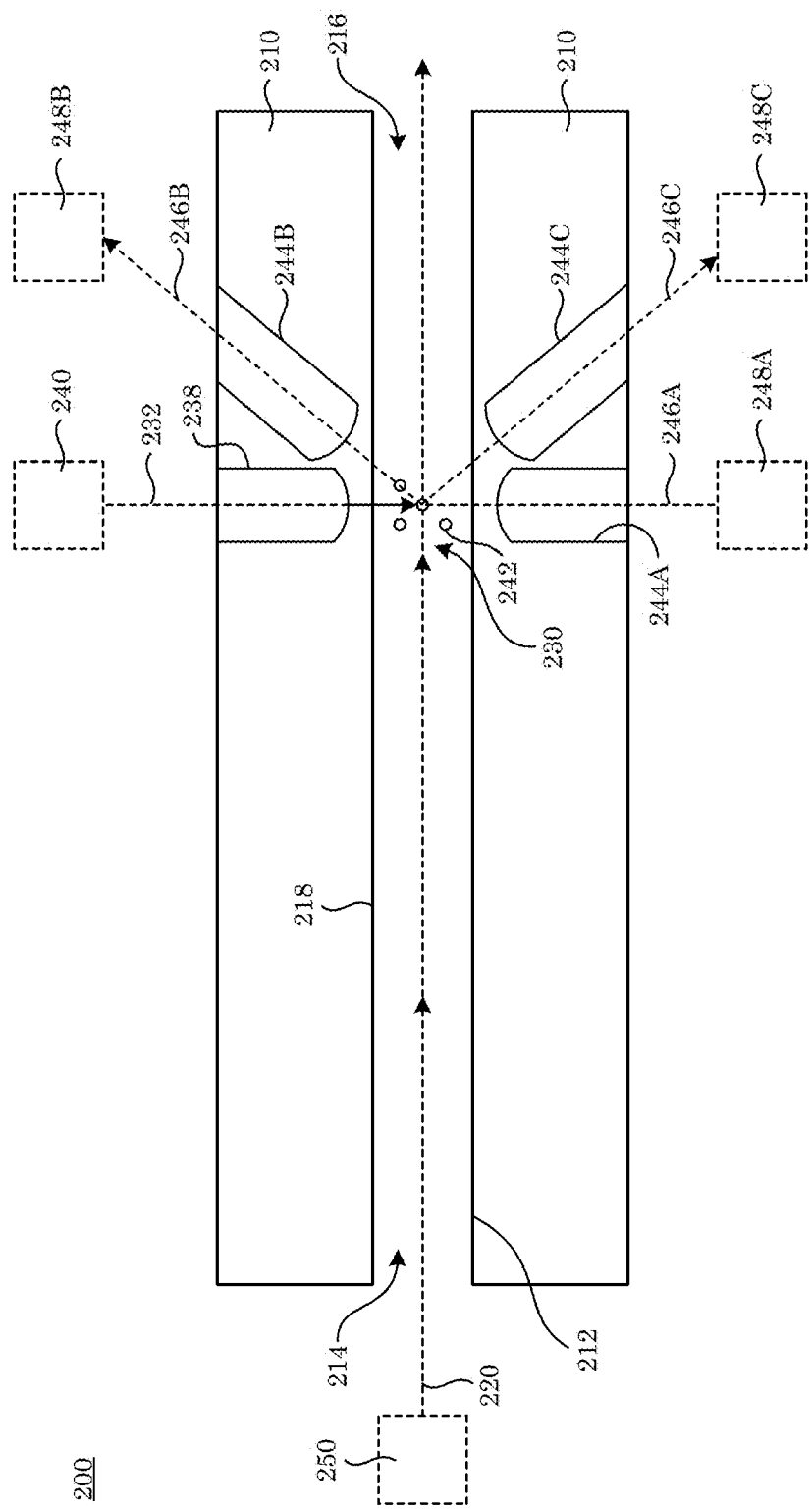
FIG. 7 shows a cut-away view of an optical flow meter.

According to an embodiment, with reference to FIG. 7, optical flow meter 200 includes a plurality of detection light paths 244 (e.g., 244A, 244B, 244C, and the like) that transmit photoanalytical light (e.g., 246A, 246B, 246C, and the like) to photodetectors 248 (e.g., 248A, 248B, 248C, and the like). It is contemplated that interaction of analytical light 232 with analyte 222 produces photoanalyte 242 (which may be the same or different chemical species as analyte 222). Accordingly, analytical light 232 can be scattered or emitted from analyte 222 to produce light that is received by photodetector 248C via detection light path 244C as photoanalyte light 246C. Analytical light 232 can be absorbed by analyte 222 to produce photoanalyte 242 (e.g., an excited state of analyte 222), wherein a portion of analytical light 232 is not absorbed or scattered and is transmitted or emitted to photodetector 248A via detection light path 244A as light referred to as photoanalyte light 246A. Photoanalyte 242 can scatter or emit photoanalyte light 246B, which is communicated via detection light path 244B to photodetector 248B.

Figure 8:
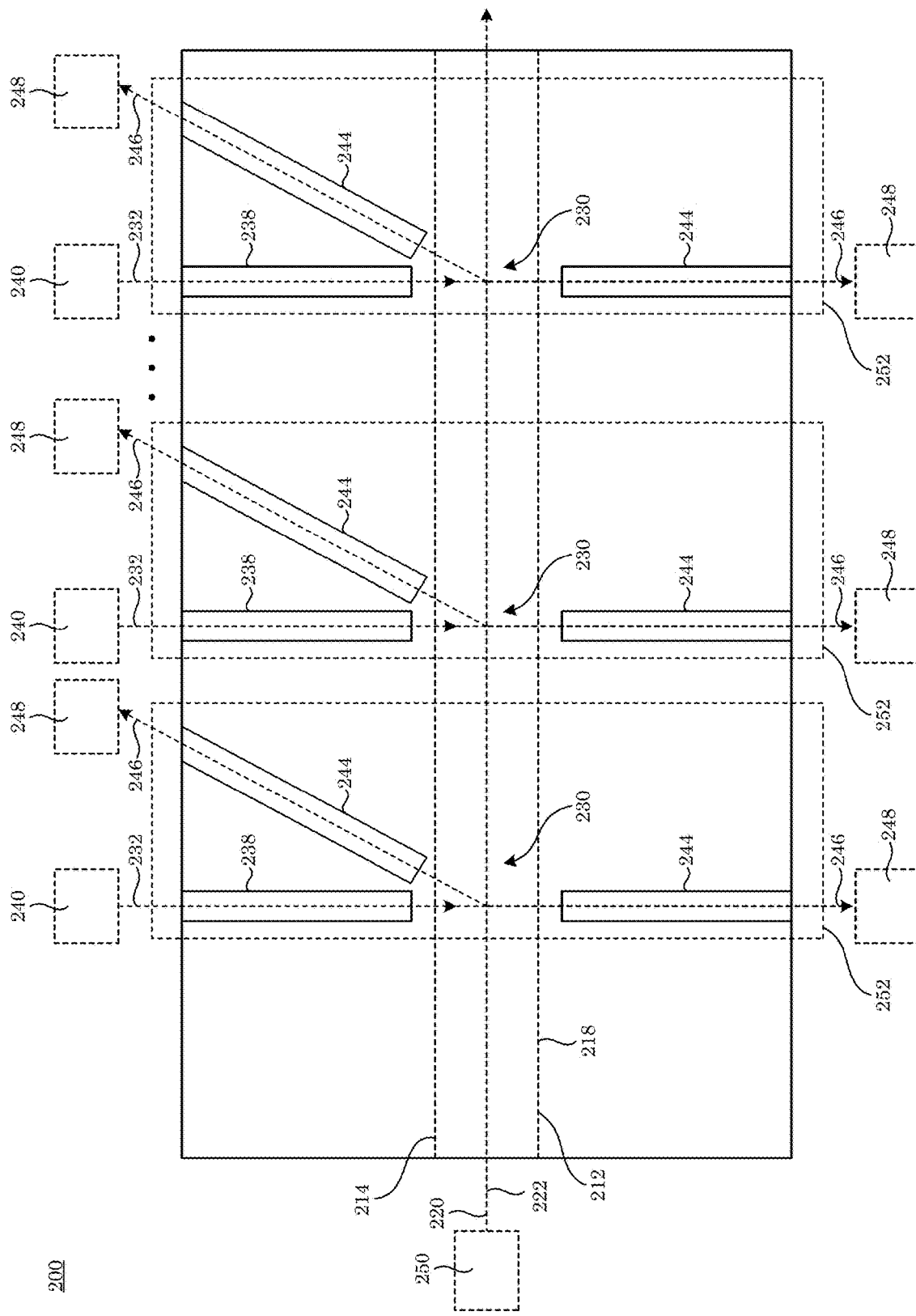
FIG. 8 shows a cut-away view of an optical flow meter that includes repeating elements.
Figure 9:
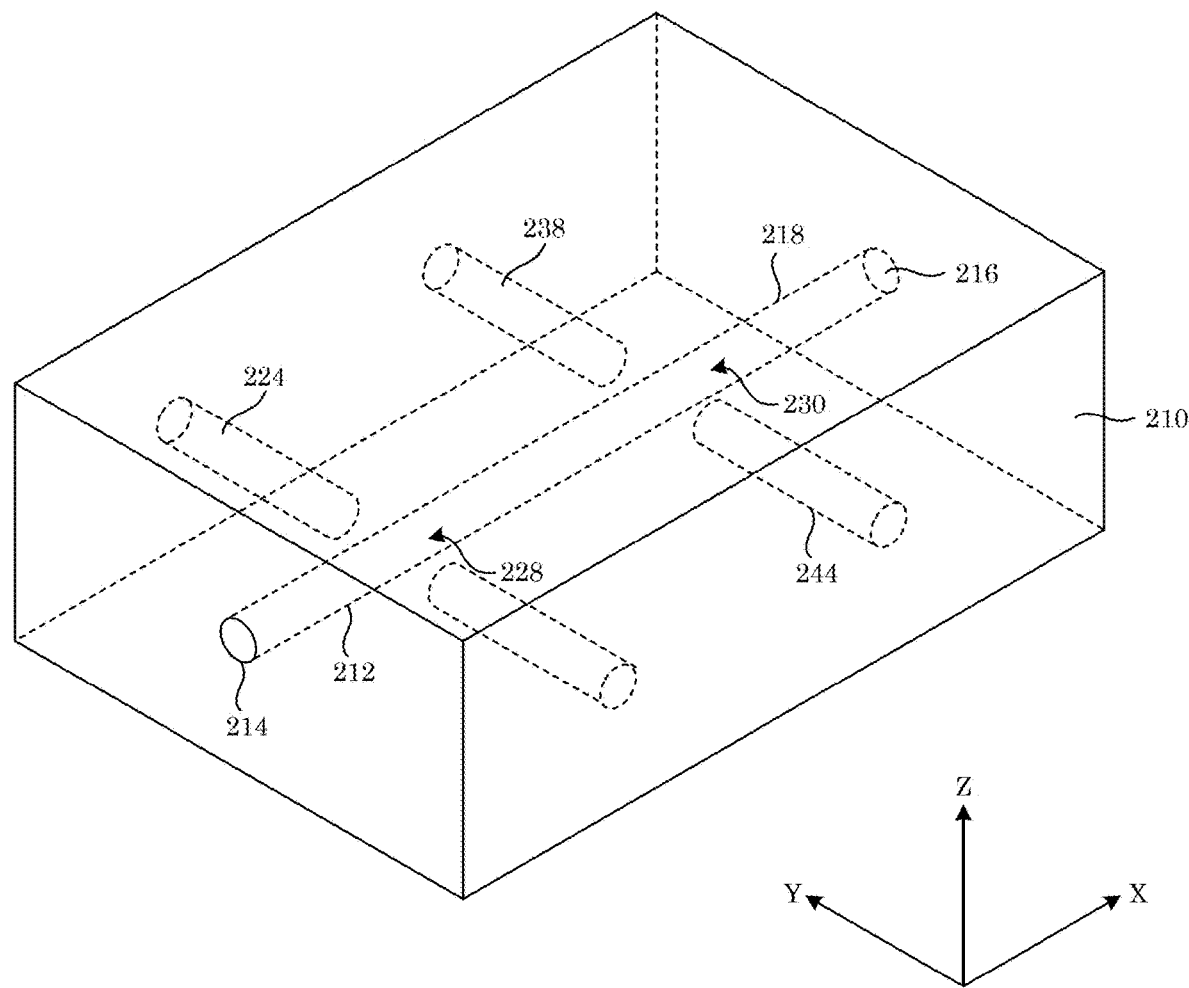
FIG. 9 shows an optical flow meter.

According to an embodiment, with reference to FIG. 8, optical flow meter 200 includes a plurality of flow readers 252 arranged in tandem along microchannel 212. In this manner, optical flow meter 200 includes with respect to flow of liquid 220 through microchannel 212 from optical interaction region 228 to fluid transmitter 216, consecutive photo interaction regions 230, analytical light paths 238, and detection light paths 244 disposed on substrate 210. That is optical interaction region 228 is interposed between fluid receiver 214 and photo interaction regions 230. Is contemplated that flow readers 252 provide determination from analyte 222 or photo analyte 242 of a dynamic process (e.g., biological cell flow cytometry), photoactive process (e.g., light absorption rate, scattering cross-section), chemical kinetics (e.g., reaction rate, e.g., with surface-mounted oligomers), chemical dynamics (e.g., cellular nutrient uptake rates, diffusion processes), and the like.

Figure 14:
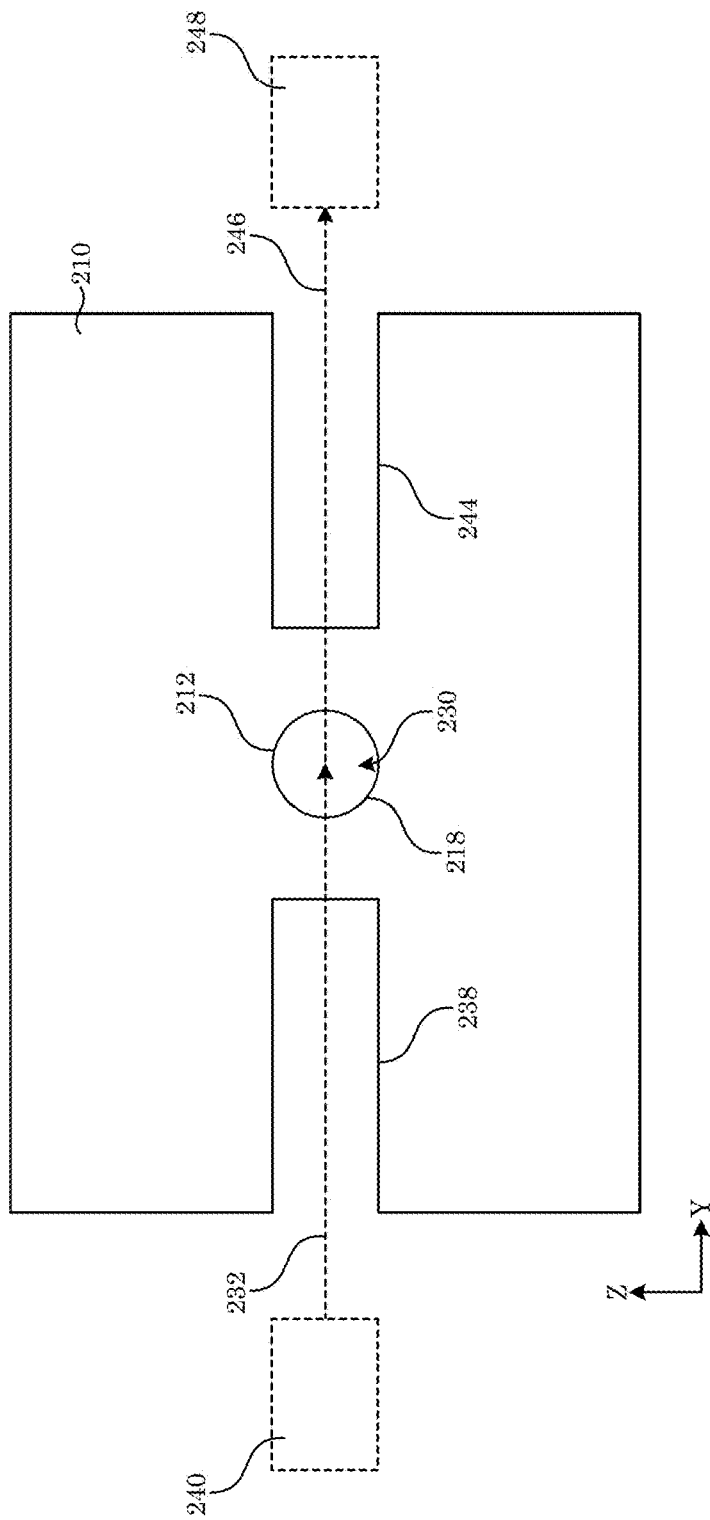
FIG. 14 shows a cross-section along line C-C of the optical flow meter shown in FIG. 10.
Figure 15:
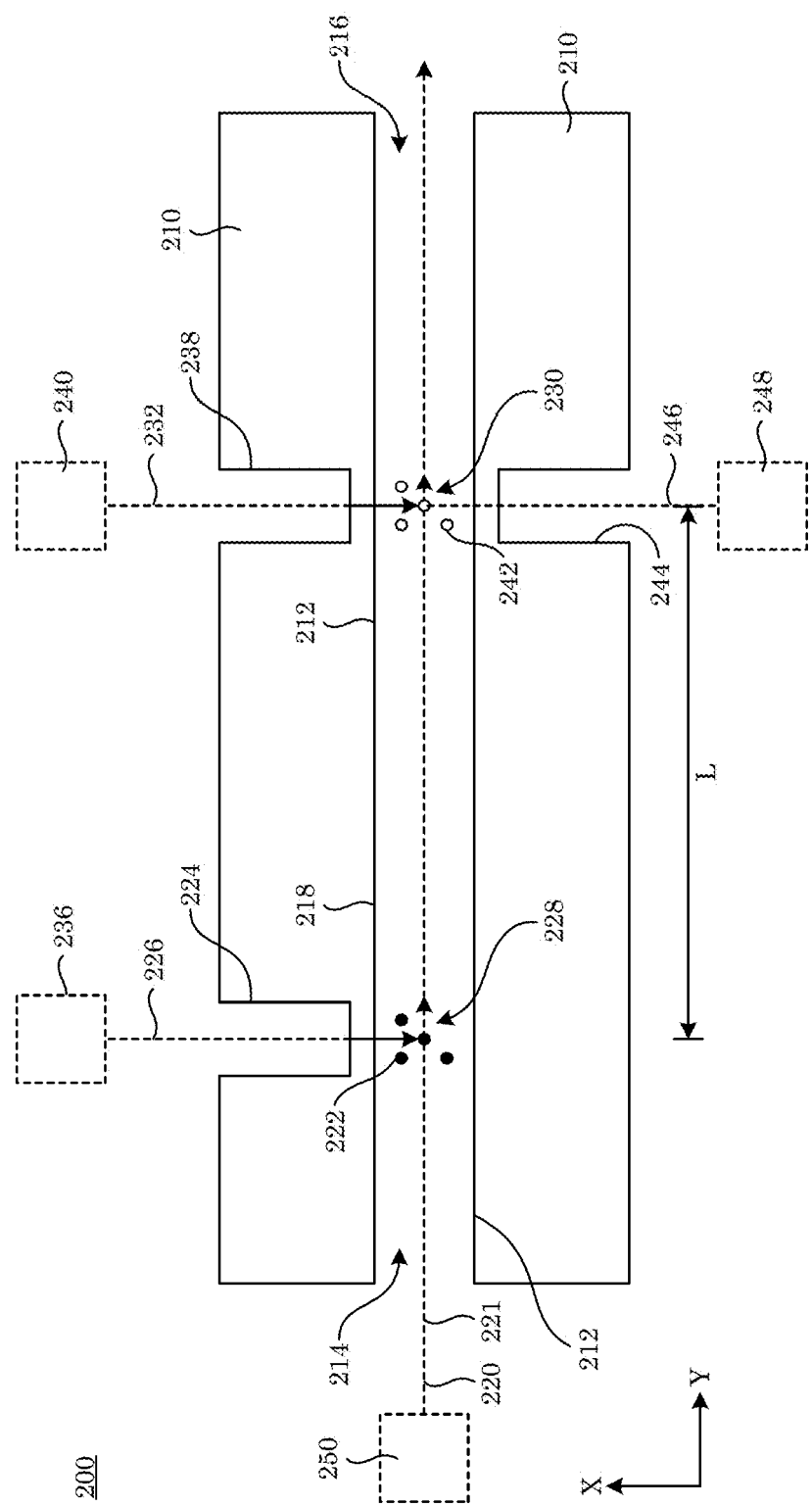
FIG. 15 shows a cross-section along line D-D of the optical flow meter shown in FIG. 11.

In an embodiment, with reference to FIG. 9, FIG. 10, FIG. 11, FIG. 12, FIG. 13. FIG. 14, and FIG. 15, optical flow meter 200 includes substrate 210 and microchannel 212 disposed in substrate 210. Microchannel 212 includes fluid receiver 214 that receives liquid 220 including pre-analyte 221; fluid transmitter 216 that receives liquid 220 from fluid receiver 214; and fluid member 218 interposed between fluid receiver 214 and fluid transmitter 218. Fluid member 218 includes optical interaction region 228 that receives activation light 226 and photo interaction region 230. Photo interaction region 230 receives analytical light 232 and communicates photoanalyte light 246 out of fluid member 218. Microchannel 212 is bounded by substrate 210. Further, fluid member 218 communicates liquid 220 from fluid receiver 214 to fluid transmitter 216. Optical flow meter 200 also includes activation light path 224 disposed in substrate 210 and is arranged at an oblique angle or right angle to fluid member 218 proximate to optical interaction region 228. Activation light path 224 receives activation light 226 from activation light source 236 and communicates activation light 226 to optical interaction region 228, wherein activation light 226 interacts with pre-analyte 221 in optical interaction region 228 to produce analyte 222. Additionally, optical flow meter 200 includes analytical light path 238 disposed in substrate 210 and arranged at an oblique angle or right angle to fluid member 218 proximate to photo interaction region 230. Analytical light path 238 receives analytical light 232 from analytical light source 240 and communicates analytical light 232 to photo interaction region 230, wherein analytical light 232 interacts with analyte 222 in photo interaction region 230 subsequent to the interaction of pre-analyte 221 with activation light 226 in optical interaction region 228 and produces photoanalyte 242 from analyte 222 in response to interaction of analyte 222 with analytical light 232 in photo interaction region 230. Photoanalyte 242 produces photoanalyte light 246 that is communicated through detection light path 244 disposed in substrate 210. Detection light path 244 is arranged at an oblique angle or right angle to fluid member 218 proximate to photo interaction region 230 and receives photoanalyte light 246 from photo interaction region 230 and communicates photoanalyte light 246 from microchannel 212 to photodetector 248.

Optical flow meter 200 can include flow controller 250 that provides liquid 220 to fluid receiver 214. Moreover, activation light source 236 is in optical communication with activation light path 224 and provides activation light 226 to activation light path 224. Further, analytical light source 240 can be in optical communication with analytical light path 238 and can provide analytical light 232 to analytical light path 238.

In an embodiment, optical flow meter 200 includes photodetector 248 in optical communication with detection light path 244 and that receives photoanalyte light 246 from detection light path 244. Moreover, analytical light source 240 can be included in optical flow meter 200, wherein analytical light source 240 is in optical communication with analytical light path 238 and provides analytical light 232 to analytical light path 238.

Figure 16:
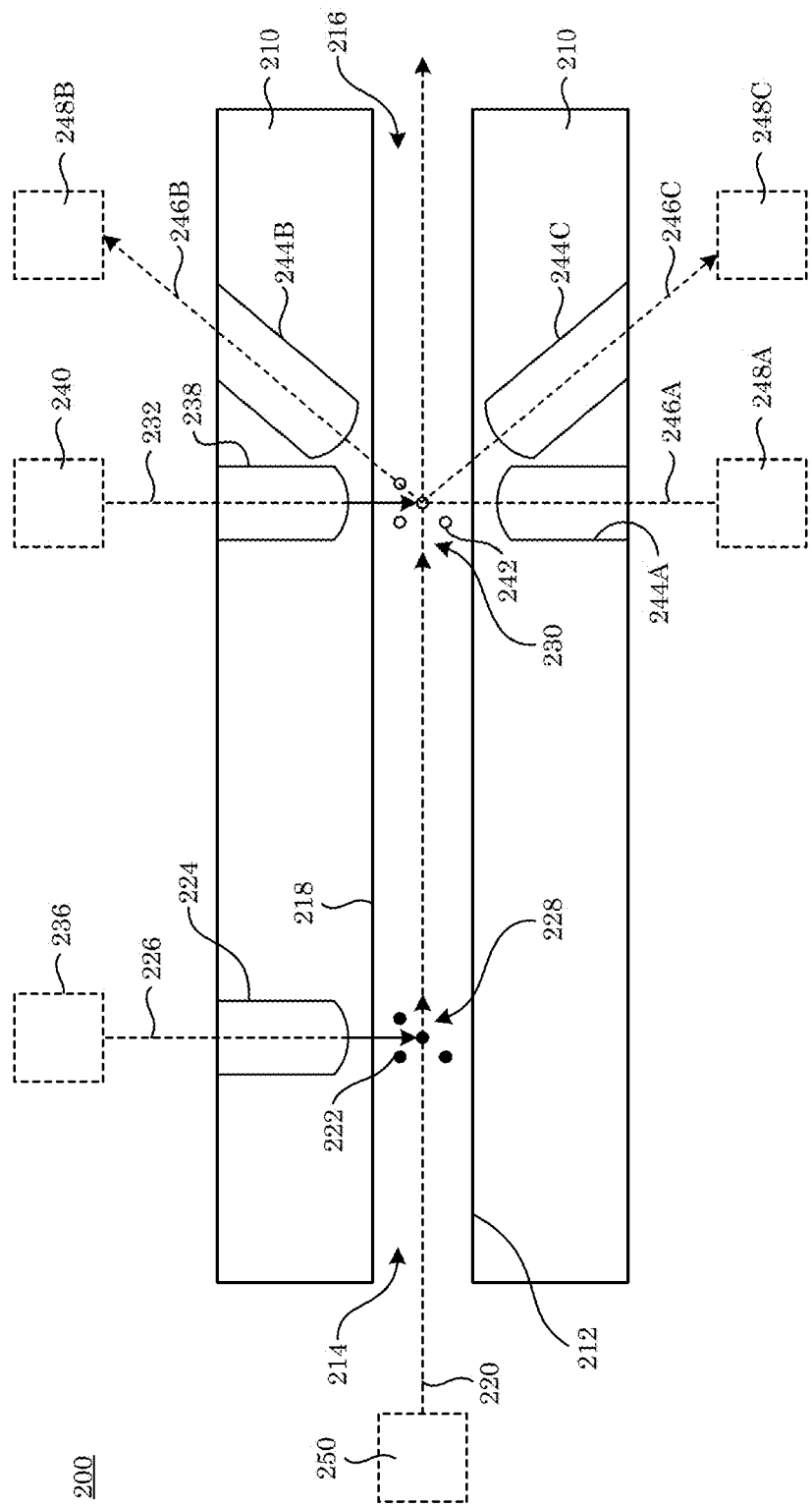
FIG. 16 shows a cut-away view of an optical flow meter.

According to an embodiment, with reference to FIG. 16, optical flow meter 200 includes a plurality of detection light paths 244 (e.g., 244A, 244B, 244C, and the like) that transmit photoanalytical light (e.g., 246A, 246B, 246C, and the like) to photodetectors 248 (e.g., 248A, 248B, 248C, and the like). It is contemplated that interaction of analytical light 232 with analyte 222 produces photoanalyte 242 (which may be the same or different chemical species as analyte 222). Accordingly, analytical light 232 can be scattered or emitted from analyte 222 to produce light that is received by photodetector 248C via detection light path 244C as photoanalyte light 246C. Analytical light 232 can be absorbed by analyte 222 to produce photoanalyte 242 (e.g., an excited state of analyte 222), wherein a portion of analytical light 232 is not absorbed or scattered and is transmitted or emitted to photodetector 248A via detection light path 244A as light referred to as photoanalyte light 246A. Photoanalyte 242 can scatter or emit photoanalyte light 246B, which is communicated via detection light path 244B to photodetector 248B.

Figure 17:
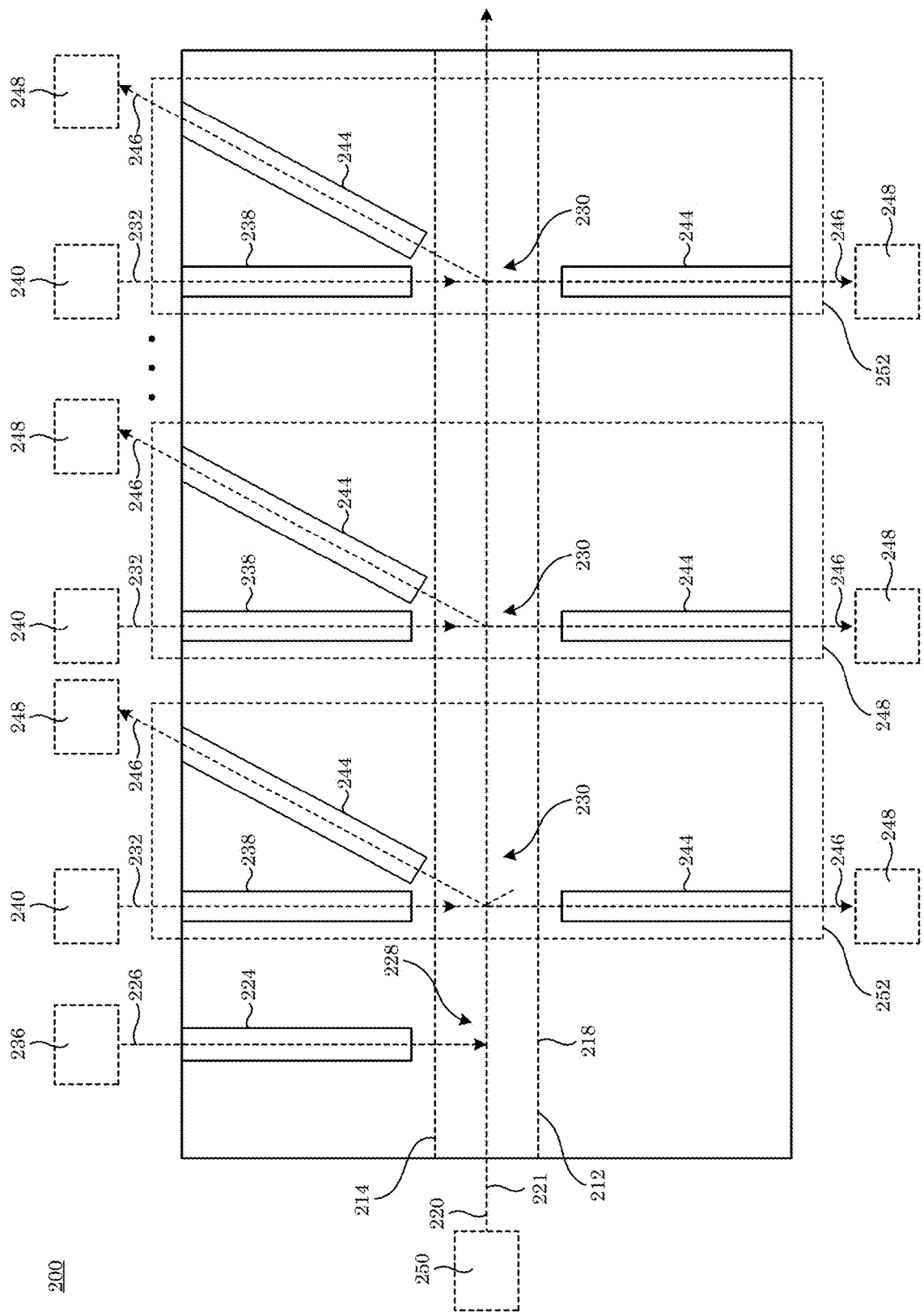
FIG. 17 shows a cut-away view of an optical flow meter that includes a plurality of repeating elements.

In an embodiment, with reference to FIG. 17, optical flow meter 200 includes a plurality of flow readers 252 arranged in tandem along microchannel 212. In this manner, optical flow meter 200 includes with respect to flow of liquid 220 through microchannel 212 from optical interaction region 228 to fluid transmitter 216, consecutive photo interaction regions 230, analytical light paths 238, and detection light paths 244 disposed on substrate 210. That is optical interaction region 228 is interposed between fluid receiver 214 and photo interaction regions 230. Is contemplated that flow readers 252 provide determination from pre-analyte 221, analyte 222 or photo analyte 242 of a dynamic process (e.g., biological cell flow cytometry), photoactive process (e.g., light absorption rate, scattering cross-section), chemical kinetics (e.g., reaction rate, e.g., with surface-mounted oligomers), chemical dynamics (e.g., cellular nutrient uptake rates, diffusion processes), and the like.

Substrate 212 of flow meter 200 can include a material that provides flow in microchannel 212. Moreover, substrate 212 can be disposed in or can include a microfluidic device. Exemplary materials for the substrate include polymeric materials such as elastomers (e.g. PDMS), epoxies and adhesives (including tapes and photocurable adhesives), acrylics (e.g. PMMA), polycarbonates, polystyrenes, polyesters, polypropylenes, cyclic olefin copolymers and hard materials, such as glasses, semiconductor materials (e.g. pure and doped silicon), and metals (e.g. aluminum). The substrate can include a combination of transparent, opaque, and reflective boundaries to control light propagation in or through an interior of flow meter 200. In an embodiment, the substrate includes a light scattering structure to absorb, scatter, or reflect light out of the optical paths or to prevent cross-talk between light paths (see FIG. 24).

It is contemplated that substrate 210 can include a flow member also referred herein as a microchannel. In an embodiment, the flow member is made in a curable polymer such as PDMS cast from a photoresist pattern provided in a photolithographic process. In an embodiment, the flow member is formed by laser oblation or chemical etching of a material such as glass. The flow member can be made by milling, cutting, embossing, and the like. Printing, e.g., 3D printing of the substrate can form the flow member or other structural element of flow meter 200.

Dimensions of the flow member are selected based, e.g., on a type of flow through flow meter 200. Dimensions such as width (W) or height (H) of the flow member (in direction X or Z) can be from 10 nm to 1 mm, specifically from 1 micrometer to 500 micrometers for water. Dimensions can depend on speed of fluid through the flow meter as well as pressure on the fluid. A shape of the flow member can be, e.g., rectangular, circular, or a combination thereof and can have a uniform or non-uniform cross section or can be confined to a straight line or fixed within a single plane along its length. For example, the flow member can include a wall that bounds the flow member and that can curve, bend, split or include or a junction that routes liquid in the flow system. A length (L) of microchannel 212 can be selected based on the size of the analytical region and that provides selected convective or diffusion of the liquid medium between optical interrogation zones. The microchannel length can be from 1 micrometer to 1 meter, and specifically from 10 micrometers and 10 centimeters. In an embodiment, the flow member has a rectangular cross section and has width and height that are independently 125 micrometers. In an embodiment, the flow member is a glass capillary that has an internal diameter of 150 micrometers.

In optical flow meter 200, fluid receiver 214 and fluid transmitter 216 connect the meter to an external source of fluid or sinks, respectively, or to fluid transmitter or fluid receiver from another flow meter, respectively. The fluid receiver and fluid transmitter can provide smooth transition to the flow member and can have similar cross-sectional dimensions. Moreover, a fluid receiver or fluid transmitter can include a seal or a mechanical device so that all fluid is directed down the microchannel. Additionally, fluid transmitter 216 can include valves or bifurcations to control liquid flow down the channel.

Fluid flows through the microchannel and can be a gas, liquid, or a combination thereof. It is contemplated that the fluid includes solid particles, compounds, or small molecules disposed in a liquid or gas. Exemplary fluids include water, bodily fluids, and organic solvents such as alcohols and fuels. The solid particles, compounds, and small molecules can include chemical compounds that absorb, scatter or emit light such as fluorescent dyes, inorganic or organic micro- or nano-particles, biological materials such as proteins and protein aggregates, lipid vesicles, exosomes, organelles and cells. Moreover, the fluid can include a combination of a solution of different materials.

Depending on substrate 212, fluid, and dimensions of the flow member, a pressure of the fluid in the system can be from 0 Pascals (Pa) to 700 kPa, specifically from 0 Pa to 130 kPa, and more specifically from 0 Pa to 70 kPa. A viscosity of the fluid can be from $1\times10^{-6}$ to 1 Pa·s, specifically from $1.0\times10^{-6}$ to 0.1 Pa·s, and more specifically from $1\times10^{-4}$ to 0.01 Pa·s. Flow can be unidirectional, and pressure can be positive. With respect to FIG. 1 through FIG. 7, the device performs similarly with flow in either direction. In an embodiment, with reference to FIG. 8, a plurality of flow readers 252 can be used to determine absolute direction of the flow.

In optical flow meter 200, analyte 222 and pre-analyte 221 can independently include reflective, absorptive, fluorescent, reactive, or optically active particles that permit contrast in the presence of light. The analyte and pre-analyte independently can be made, e.g. from fluorescein and derivatives thereof. Specifically, a derivative could be fluorescein-conjugated dextran or a CMNB-caged carboxyfluorescein, and its derivatives. The analyte or pre-analyte independently can be selected based on the wavelength of light to activate, deactivate, or excite the analyte or pre-analyte, respectively. The analyte or pre-analyte can also be selected, independently, based on its diffusion coefficient, absorbance, or emission spectra. Analyte and pre-analyte excitation, bleaching, and emission wavelengths independently can be from 240 nm and 1000 nm, and specifically from 350 nm and 750 nm.

In optical flow meter 200, activation light paths (224, 238, 244) can be disposed in substrate 212 as a microchannel, e.g., a void in substrate 212. The light paths are in optical communication with light source (e.g., 236, 240) or photodetector 248 by an optical fiber or along light paths as activation light 226, analytical light 232 or photoanalyte light 246. The light path can include a bifurcation or optical element that changes a direction, intensity, or spectrum of light along the light path.

In optical flow meter 200, analytical light source 240 can include light-emitting diodes or lasers to emit light at a desired wavelength. The properties of the source light and its type can be selected based on the packaging of the flow meter, level of interaction with analyte 222, or transmission of light by activation light path 238.

In optical flow meter 200, analytical light 232 can be used to induce fluorescence, scatter, or absorption in photoanalyte 242 in optical interaction region 228. In an embodiment the photoanalyte 242 is fluorescein. The analytical light may be selected based on interaction with photoanalyte 242 and can have a wavelength from 240 nm to 1000 nm, more specifically from 350 nm to 750 nm. In an embodiment, the wavelength of the analytical light is from 450 nm to 500 nm. In an embodiment, the wavelength is from 470 nm to 490 nm. An intensity of the analytical light is selected based on interrogation of the photoanalyte, nature of the flow, and desired characteristics of the detected light. The intensity of the analytical light can be from 1 nanowatt (nW) to 1 W. In an embodiment, the intensity of the analytical light can be from 1 microwatt to 70 mW.

Figure 24:
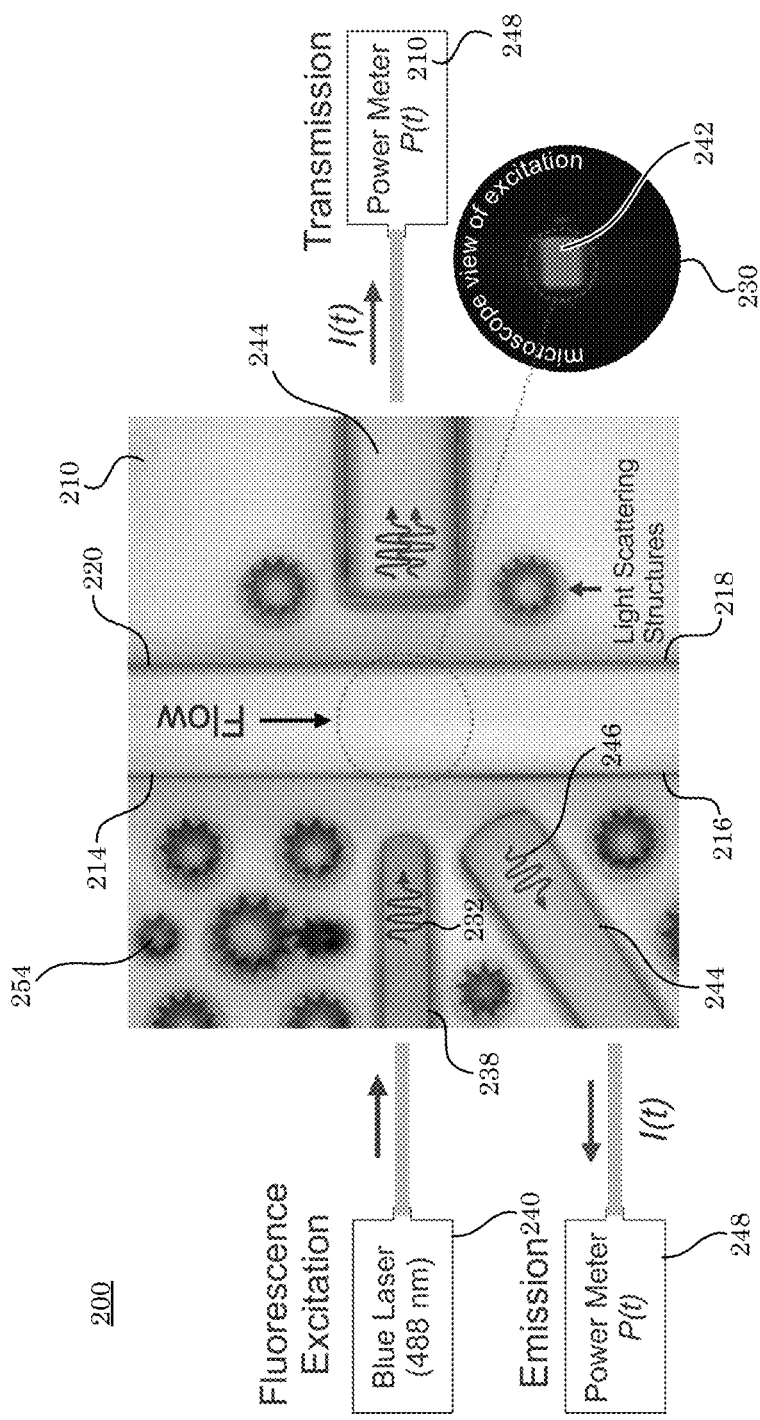
FIG. 24 shows an optical flow meter.

In optical flow meter 200, analytical light path 238 transmits light from light source 240 to photo interaction region 230. Moreover, the light path can include a filter or bifurcation to reduce the intensity of light or direct part of the light to a light intensity meter. In an embodiment, analytical light path 238 includes a waveguide filled with optical material that permits total internal reflection of light. In an embodiment, the optical material is a photocurable adhesive that has a higher index of refraction than the substrate. In an embodiment, the analytical light path has a curved end to shape the light in the optical interaction region 230. In an embodiment, the light is approximately uniform intensity across the optical interaction region as shown in FIG. 24.

In optical flow meter 200, photo interaction region 230 is where analytical light 232 interacts with the analyte 222 or photoanalyte 242 to induce fluorescence, bleaching, scatter, or absorption by the analyte 222 or photoanalyte 242, independently. In an embodiment, the analytical light induces the photoanalyte to emit fluorescence. In an embodiment, the analytical light causes some of photoanalyte 242 to emit fluorescent light and some of photoanalyte 242 to bleach (e.g., be destroyed by the analytical light and stop emitting fluorescence). The intensity of the analytical light with the amount of time the photoanalyte spends in the photo interaction region 230 (e.g., the speed of the photoanalyte) can determine an amount of bleaching versus emitted fluorescence.

In optical flow meter 200, photoanalyte 242 can be a deactivated state of analyte 222, an excited state of analyte 222, or a modified variant of analyte 222. The type of photoanalyte 242 can be selected based on an interaction time with analytical light 232, color of emitted or scattered light, or an increase in signal to noise ratio in photodetector 248.

In optical flow meter 200, analytical light path 244 carries detection light from photo interaction region 230. The light path can include filters or bifurcations to reduce the intensity of light or direct part of the light to a light intensity meter or spectrometer. In an embodiment, detection light path 244 is a waveguide filled with optical material that permits total internal refection of light. In an embodiment, the optical material is a photocurable adhesive that has a higher index of refraction than the substrate. In an embodiment, the detection light path includes a lens element to focus light into the light path and is slightly wider than the analytical light path in order to capture more light from photo interaction region as shown in FIG. 24.

In optical flow meter 200, analytical light 246 can be fluorescence, scattered light, or a change in transmission of the analytical light 232 resulting from interaction of analytical light 232 with photoanalyte 242 in optical interaction region 230. In an embodiment the detection light is emitted light from a fluorescent photoanalyte. In an embodiment, the detection light is loss of fluorescence due to photobleaching of the photoanalyte. Detection light 246 can be modified by components of output light path 244. This light can have a wavelength from 240 nm to 1000 nm, and specifically from 350 nm to 750 nm.

In optical flow meter 200, photodetector 248 records properties of detection light 246. In an embodiment, photodetector 248 is connected to the detection light path by an optical fiber. In an embodiment, the optical fiber is a 125-micrometer diameter multimode fiber that carries a visible wavelength of light. In an embodiment, the photodetector is a broadband photodiode connected to a power meter. In an embodiment, the photodiode had a spectral range from 200 nm to 1100 nm. In an embodiment, the photodiode is preceded by an optical filter that excludes the analytical light to enhance collection of emitted fluorescence light over analytical light. In an embodiment the filter blocks wavelengths outside the range from 510 nm to 530 nm, allowing only fluorescence emitted from fluorescein to reach the detector. In an embodiment, the combined photodiode/power meter has a sensitivity in a power range from 10 pW to 100 mW. In an embodiment, the photodetector is a spectrometer that measures a spectrum of detection light 246. The photodetector can be a photodiode or the like integrated into the flow meter or interfaced with the substrate.

In an embodiment, optical flow meter 200 is connected to a flow controller 250 that serves to drive fluid and analyte through the system. In an embodiment, the flow controller is a syringe pump that delivers volumetric flow in the range of 100 picoliter per minute (pL/min) to 100 microliters/min. In an embodiment, the flow controller is a vessel filled with fluid at a fixed height above the outflow of the meter. Gravity can control pressure on the fluid and drive the flow rate as a function of the fluidic resistance through the system. In an embodiment, external pressure is applied to the fluid-filled vessel in order to provide more pressure drop than can be reasonably achieved with gravity alone. Other flow controllers can be attached to the flow meter and modified with or without feedback from the flow meter to control volumetric flow. Exemplary flow controllers include peristaltic and rotary pumps, piston pumps, diaphragm pumps, and the like.

Optical flowmeter 200 can include additional light paths for light collection. In an embodiment, detection light path 244A communicates detection light 246A to a power meter 248A in order to acquire a change in intensity or spectrum of light that is transmitted through the photoanalyte. In an embodiment, this measurement estimates power of the analytical light incident on the photoanalyte and measures time-dependent changes in the interaction between the analytical light and the photoanalyte through processing of acquired light.

In an embodiment, a supplementary detection light path 244B collects and communicates light 246B from the photo interaction zone to a photodetector 248B. In an embodiment, light path 244B is on the same side of the microchannel as the analytical light and oriented at some angle and shape in order to maximize collection of emitted or scattered light from the photoanalyte while minimizing the amount of analytical light reflected into light path 244B.

In an embodiment, a supplementary detection light path 244C collects and communicates light 246C from the photo interaction zone to a photodetector 248C. In an embodiment, light path 244C is on the opposite side of the microchannel as the analytical light and oriented at some angle and shape in order to maximize collection of emitted or scattered light from the photoanalyte while minimizing the amount of analytical light reflected into light path 244C.

Optical flowmeter 200 can include repeated optical units 252 that independently can include an analytical light 232 and analytical light path 238; detection light 246A and detection light path 244A; detection light 246B and detection light path 244B; or detection light 246C and detection path 244C.

In an embodiment, repeated optical elements 252 measure the displacement of photoanalyte as it flows down the channel. In such a way, accuracy and knowledge of the time-dependent nature of the fluid flow is improved. In addition, convention and diffusion of the photoanalyte is determined. Moreover, time-dependent changes in the photoanalyte, including photoanalyte disposed as a droplet or vesicle containing a time-dependent process such as an enzymatic reaction, or a photoanalyte that appear or degrade as a result of a biological process contained in a cell, are measured as particles move, with time, past subsequent repeated optical elements. Furthermore, repetitive measurements of photoanalytes such as those just mentioned that are not changing in time would provide additional validation of the measurements and produce means to assess the statistical variation from repeat measurements.

It is contemplated that flow meter 200 includes a plurality of microchannels to measure flow rates from a plurality of samples in a monolithic apparatus. A bifurcation in the flow member scales measured flow from one split of the fluid to another. In such a way, ratios of a large flow are provided as smaller volumetric components to determine flow in a single apparatus.

In optical flow meter 200, activation light source 236 can include light-emitting diodes or lasers to emit light at a desired wavelength. The properties of the source light and type can be selected based on packaging of the flow meter, level of interaction with pre-analyte 221 or analyte 222, and transmission of light by activation light path 224.

In optical flow meter 200, activation light 226 can be used to imprint contrast to analyte 222 or pre-analyte 221. In an embodiment, pre-analyte 221 is a caged fluorophore. In an embodiment, the analyte is fluorescein. The activation light can be selected based on whether activation light interacts with the pre-analyte or analyte. A wavelength of light can be from 240 nm to 1000 nm, and specifically from 350 nm to 750 nm. In an embodiment, the wavelength of the activation light is 375 nm. The intensity of the activation light is selected based on optical properties for modifying the analyte or pre-analyte, the nature of the flow, and selected characteristics of detected light. Intensity of the activation light is from 1 nW to 100 mW. In an embodiment, the intensity of the activation light is from 1 microwatt to 70 mW.

In optical flow meter 200, analytical light path 224 includes a waveguide that transmits light from light source 236 to optical interaction region 228. Moreover, the light path can contain filters or bifurcations to reduce the intensity of light or direct part of the light to a light intensity meter. In an embodiment, activation light path 224 was a waveguide filled with optical material that permits total internal refection of light. In an embodiment, the optical material was a photocurable adhesive that has a higher index of refraction than the substrate. In an embodiment, the activation light path had a curved end or lens to shape the light in the optical interaction region 228. In an embodiment, the light was approximately uniform intensity across the optical interaction region.

In optical flow meter 200, optical interaction region 228 is where activation light 226 interacts with the analyte 222 or pre-analyte 221 to modify the analyte 222 or pre-analyte 221. In an embodiment, modification of pre-analyte 221 produces analyte 222. A modification of pre-analyte 221 can include a chemical modification such as uncaging, fluorescence activation, photobleaching, and the like. In an embodiment, the analyte 222 or pre-analyte 221 are a fluorophore or a caged-fluorophore such as fluorescein or caged-fluorescein.

A process for making optical flow meter 200 includes defining the microflow channel and light paths in the substrate. The process for defining the flow channel can involve subtractive manufacturing (e.g. laser ablation, engraving, cutting, etching, etc.) or additive manufacturing (e.g. 3D printing, controlled deposition, templated substrate growth, and the like) or photolithography to define topographic features that will become or will be used to produce constituent elements of the flow meter. In an embodiment, topographic features were produced on silicon wafers using photolithography. A negative photoresist polymer (e.g., SU8) was used as the photosensitive polymer to produce the topographic patterns on a silicon wafer. In an embodiment, the SU8 features were approximately the same height as the optical fiber diameter. The SU8 features are typically treated with a silane to facilitate removal of substrates after casting. Alternative methods to produce topographic features include milling and embossing of metals or plastics or etching materials such as glass and silicon.

In an embodiment, features in substrate 210 are produced by casting and curing a liquid material, such as poly(dimethylsiloxane) (PDMS) against the topographic features. Other exemplary casting materials include epoxy, adhesives or curable polymers or melts. Alternative means of fabricating a substrate in the milli or micro or nanoscale size range include 3D printing, cutting, milling, laser writing, and embossing.

In an embodiment, the substrate is bonded to another substrate so as to form a bottom of the channel features and to form open-ended microchannels that include the flow member and light paths. In an embodiment, the substrate is bonded to a flat surface of the same material as the cast substrate so that the index of refraction of the material is the same around the exterior of the light guides. In an embodiment, the substrate and bonded layer were PDMS and the bonding was performed by oxygen plasma treatment of both layers prior to placing them together. In an embodiment, the PDMS layers are bonded together using a layer of liquid PDMS and the device bond following heat treatment to cure the liquid PDMS. Other methods to form the enclosed channels include using an adhesive such as epoxies, double-sided tape, or a mechanical force provided by a device such as a clamp or vacuum pump.

In an embodiment, the light paths are filled with an appropriate material such as an optical liquid or adhesive or matching fluid to produce total-internal reflection and carry light along the microchannel. Alternatively, the light paths can be formed by modifying the optical properties of the substrate, e.g. by chemical, thermal, or optical manipulation, such that these regions become capable of confining and transmitting light as a waveguide. As waveguides, the light paths then function to deliver light to and collect light from material in the photo interaction region of the flow member. In an embodiment, the light paths are filled with PDMS that has a higher crosslinker ratio (e.g. 1:5). In an embodiment, the material filling the light paths was a UV curable optical adhesive (e.g., commercially available as Norland Optical Adhesive 88), which has a higher index of refraction compared to PDMS.

In an embodiment, a process for making optical flow meter 200 includes incorporating an optical fiber to transmit light from sources and detectors to and from the device. In an embodiment, the height of channel for the light paths was set to match the diameter of bare fiber, and the width at the entrance of the light path channel where the fiber is inserted is set to be a small factor (e.g. 3 times) larger than the diameter of the fiber. In an embodiment, the width of the light path channel tapers down to width of the fiber to stop the fiber insertion at a certain point. In an embodiment, the width of the light path was narrowed further (e.g., 50 micrometers wide) in order to more carefully pinpoint the light impinging on the flow member (see FIG. 9) or widened (e.g. 150 um) to collect more light from the flow member. Following insertion of the fibers into the light path, an embodiment was to cure the coupling fluid with ultraviolet light or heat to lock the fibers in place. Alternatively, the waveguides can be solid, and light can be launched into the light paths by gluing fibers to the ends of light paths or focusing light into light paths using optical elements.

Optical flow meter 200 has numerous beneficial uses, including determining a flow rate of liquid 220. In a process for determining flow rate of the liquid, analyte 242 is produced at 230 from analyte 222. In this process, the analyte 222 can be fluorescent.

Figure 18:
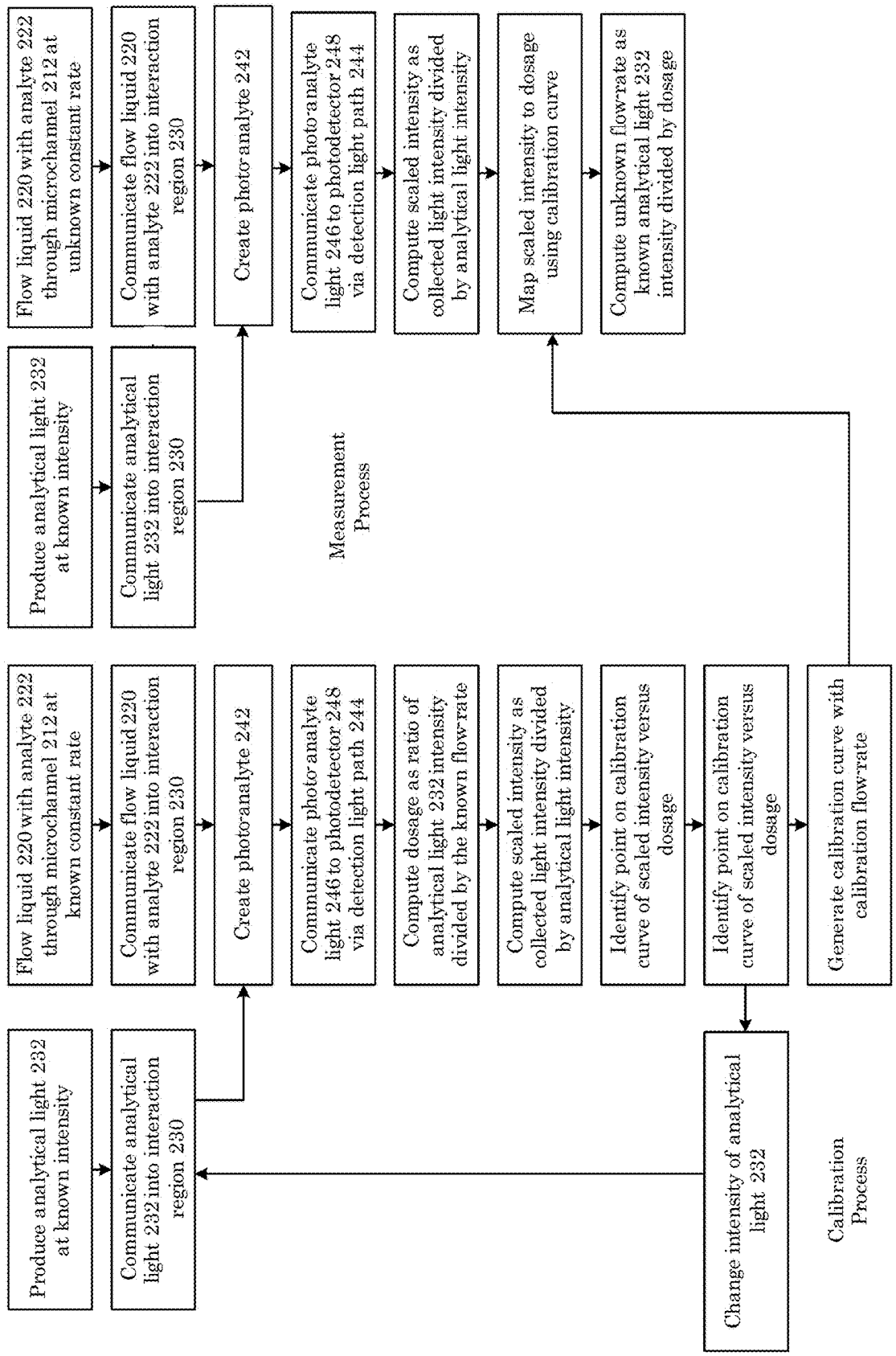
FIG. 18 shows a flow chart for measuring flow.

In an embodiment, with reference to FIG. 18, a process for determining the flow rate of liquid 220, with optical flow meter 200, includes: flowing liquid 220 including analyte 222 through microchannel 212; communicating liquid 220 with analyte 222 to photo interaction region 230; producing analytical light 232; communicating analytical light 232 through analytical light path 224 to photo interaction region 230; subjecting analyte 222 to analytical light 232; producing photoanalyte 242 with analytical light 232, depending on the intensity of analytical light; destroying photoanalyte 242; creating photoanalyte light 246; communicating photoanalyte light 246 from photo interaction region 230 to photodetector 248 via detection light path 244; and recording detection light intensity versus time to determine the flow rate of liquid 220.

Analyte 222 can be converted to photoanalyte 242 by photo damaging the analyte with light more powerful than is used to excite fluorescence. In this process, the method for determining flow rate involves measuring the intensity of photoanalyte light 246 as a function of the intensity of analytical light 232. The method depends on measuring the remaining fluorescence from photoanalyte 242 that has not been bleached, i.e., destroyed.

In the process for determining flow rate, the flow rate can change the intensity of the photoanalyte light 246, which can be used to determine relative flow rate changes. The measurement process can also involve a calibration process, whereby a scaling factor is determined to convert the intensity of photoanalyte light 246 to flow rate. The scaling factor can be determined by calibrating the photoanalyte light 246 to a known flow standard, such as a gravimetric flow meter. The intensity profile of photoanalyte light 246 can be mapped to flow rate or analytical light intensity. In such a way, a scaling factor can be determined to relate the measurements of the optical flow meter to a valid or traceable scale of volumetric flow rate. The scaling factor can depend on the nature of analyte and photoanalyte.

Figure 19:
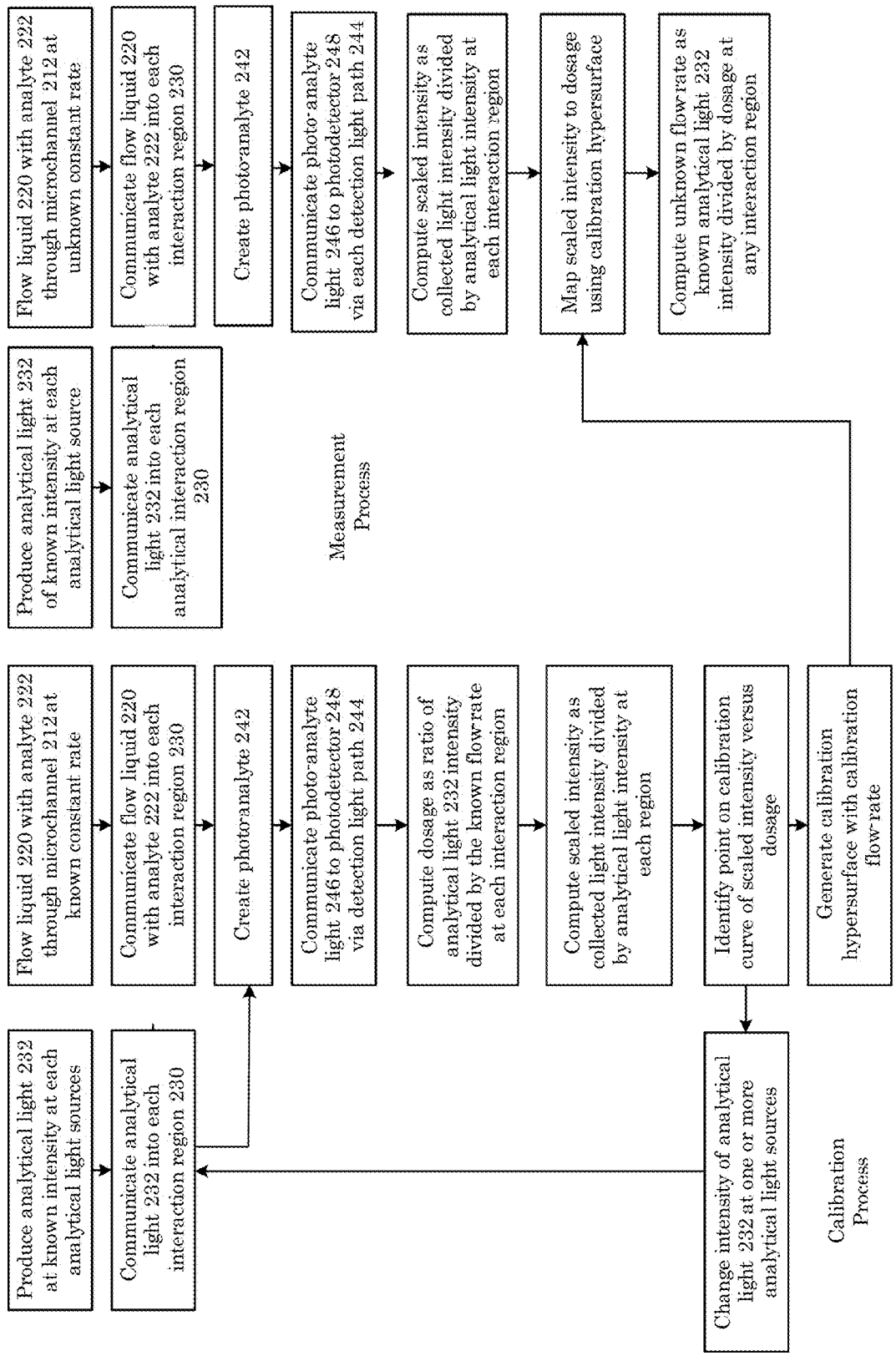
FIG. 19 shows a flow chart for measuring flow with a laser and an optical flow meter that includes repeating elements.

In an embodiment, with reference to FIG. 19, a process using analytical light can also include multiple photo interaction regions 230. Here, measurement is as above with a scaling relationship determined separately for each photo interaction region, based on dependencies described above.

Figure 20:
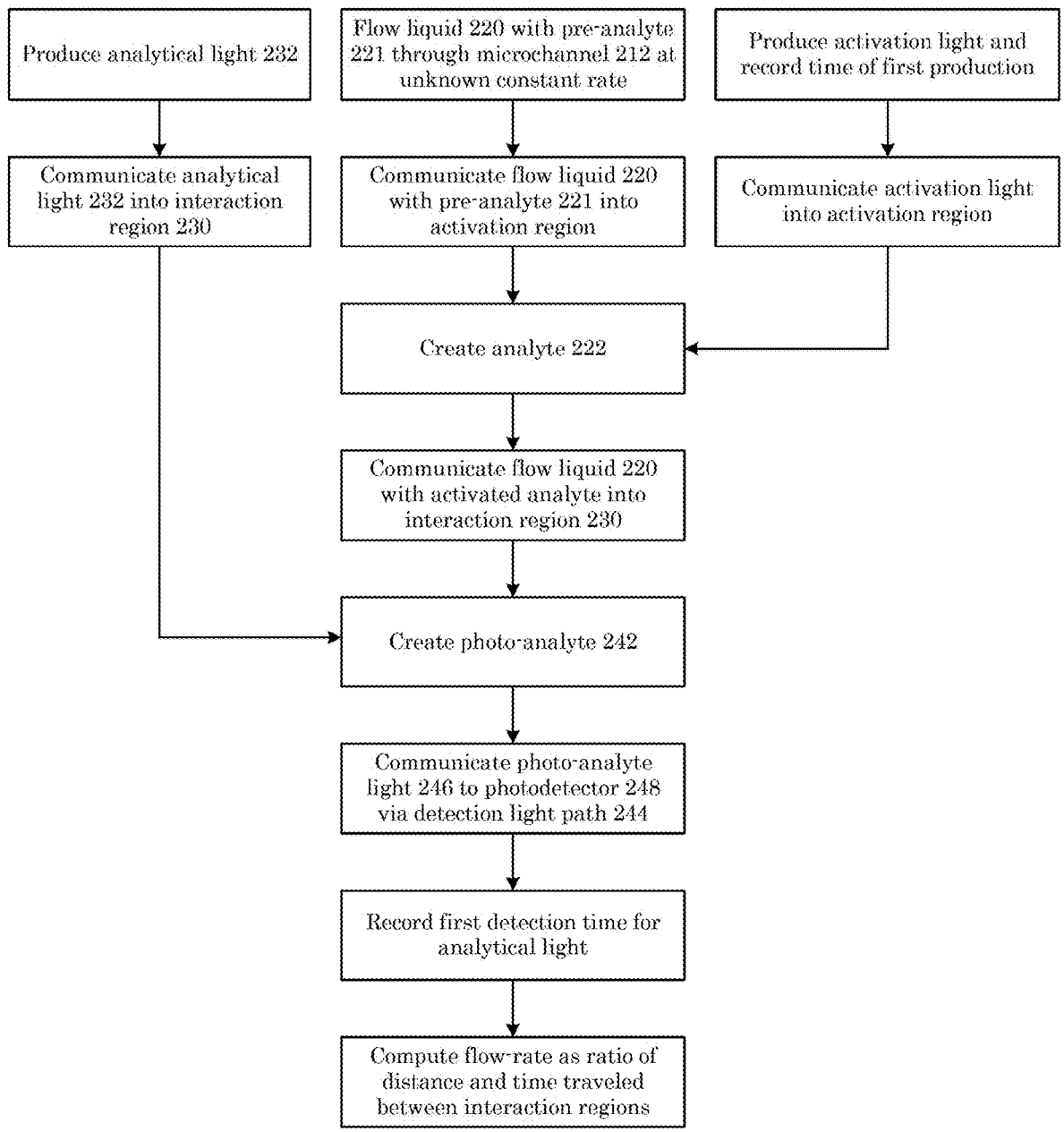
FIG. 20 shows a flow chart for measuring flow with an activation laser.
Figure 21:
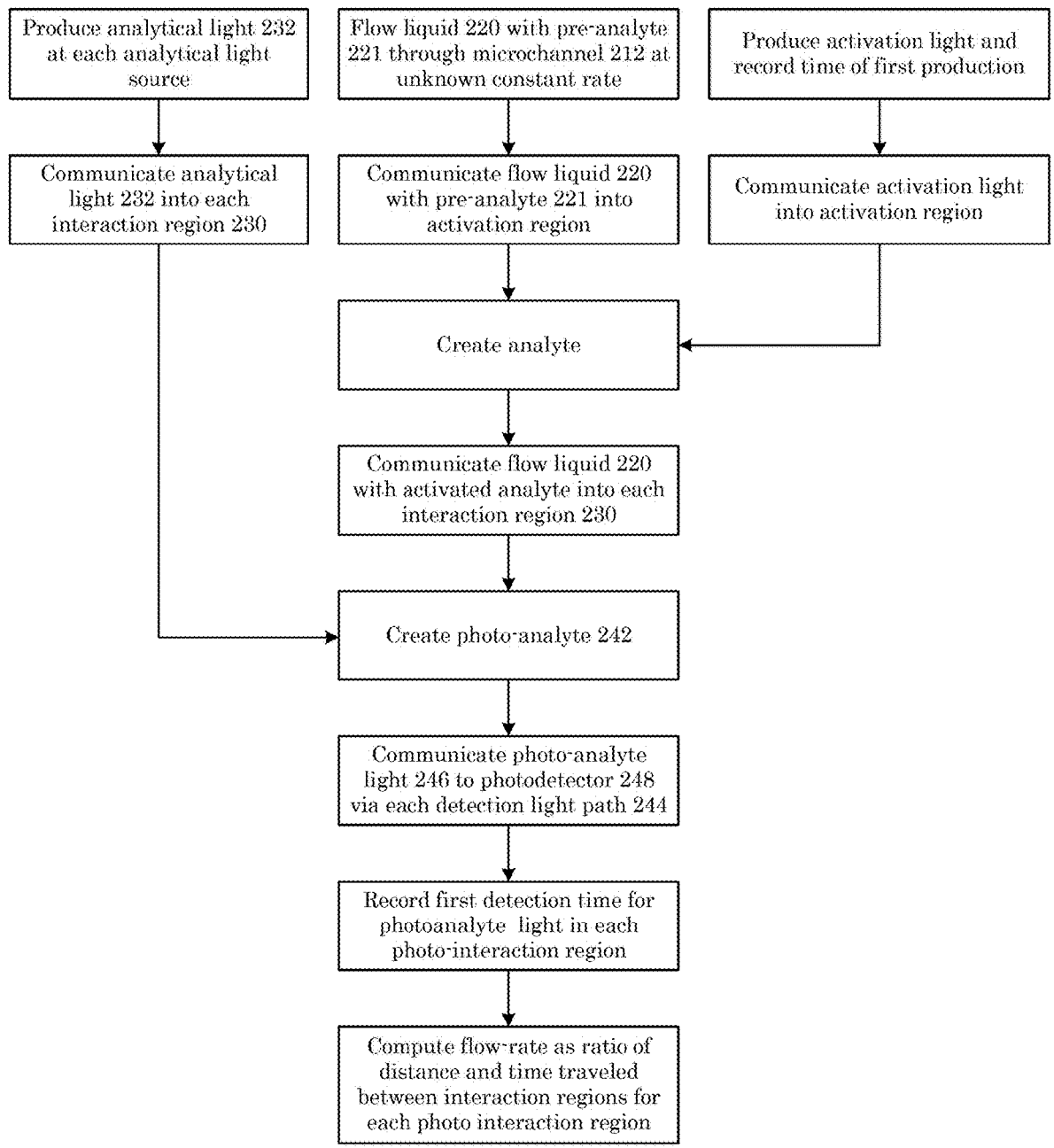
FIG. 21 shows a flow chart for measuring flow with an activation laser and an optical flow meter that includes repeating elements.

In an embodiment, with reference to FIG. 20, a process for determining the flow rate of liquid 220 with optical flow meter 200, occurs via a time-of-flight determination and includes: flowing liquid 220 including pre-analyte 221 through microchannel 212 and communicating liquid 220 with pre-analyte 221 to activation region 228; producing activation light 226 from activation light source 236; communicating activation light 226 to activation region 228 via activation light path 224 to produce analyte 222; communicating liquid 220 with analyte 222 to analytical interaction region 230; producing analytical light 232 and communicating activation light 232 through activation light path 244 to optical interaction region 230; subjecting activated analyte to activation light 232; producing photoanalyte 242 and photoanalyte light 246 from activation light 232; communicating photoanalyte light 246 from optical interaction region 230 to photo detection 248 via detection light path 244; recording intensity of detected light as a function of time; and calculating flow rate based on ratio of distance, L, between activation region 228 and analytical interaction region 230, and time between creation of activated analyte and measurement of photoanalyte light.

The process for determining flow rate of liquid 220 can include pulses or continuous application of activation light 226 to the analyte 222 or pre-analyte 221.

The process for determining the flow rate of liquid 220 can including measuring the timing or change of activation light 226 after interaction with analyte 222 or pre-analyte 221 with a light path and detector.

The process for determining the flow rate of liquid 220 can include determining a calibration factor from the flow rate of liquid 220 as the function of time. The process for determining the flow rate of liquid 220 can include calibrating flow controller 250 from the calibration factor.

The process for determining the flow rate of liquid 220 can induce measuring the time difference between application of activation light 226.

The process for determining the flow rate of liquid 220 can include detecting photoanalyte 242 with photodetector 248 through detection light path 244A and detection light 246A; detection light path 244B and detection light 246B; detection light path 244C and detection light 246C; or a combination thereof. A spectral filter can be optically interposed between light path and detector to selectively remove activation or analytical light from the detection light prior to photodetector 248.

The process of determining the flow rate of liquid 220 can include comparing measurement readings from photodetector 248 with either dimensional measurements or a mathematical description of the device. The measurements or mathematical description can include, e.g., the microchannel size and shape, the activation light 226 and photoanalyte light 246, the flow rate of liquid 220, the physical properties of the analyte 222 or pre-analyte 221, the properties of the photodetector, light-transmitting properties of the activation light path 224 and analytical light path 238, and properties of the liquid 220.

In the process for determining the flow rate of the liquid, flowing liquid 220 including analyte 222 or pre-analyte 221 through microchannel 212 includes flowing the liquid 220 through microchannel 212 at a constant rate. A constant flow rate can be achieved, e.g., by driving constant flow such as from a syringe pump or by ensuring constant pressure at the fluid receiver 214 or fluid transmitter 216. A constant pressure can be achieved by connecting the fluid receiver 214, e.g. to a pressure source or gravimetric flow controller. It should be appreciated that the volumetric flow rate of liquid 220 in the fluid receiver 214 is the same as in the microchannel 212, optical interaction region 228, photo interaction region 230, and fluid transmitter 216.

In the process for determining flow rate of liquid, the measurement of flow determined from the optical measurements or mathematics can be calibrated against a pump or flow meter, e.g., comparing the measurements with recordings of liquid mass over time on a gravimetric flow system in a metrology laboratory.

In the process for determining the flow rate of the liquid, communicating activation light 226 through activation light path 224 to optical interaction region 228 using a measurable and known intensity of activation light 226 through the activation light path 224 and into the optical interaction region 228. The activation light 226 can be time changing or constant. Moreover, the intensity of activation light 226 can be controlled, e.g., by an electronic power supply controlling the activation light sources 236 or filters that only transmit a fraction of the light emitted by the activation light sources 236.

In the process for determining the flow rate of the liquid, exposing analyte 222 or pre-analyte 221 with activation light 226 induces a reaction or other physical process that changes the composition or physical properties of the analyte 222 or pre-analyte 221. This transformation can, e.g., destroy the pre-analyte 221 or produce analyte 222. Exposing photoanalyte 242 to analytical light 232 can induce the photoanalyte to emit photoanalyte light 246 or scatter analytical light into a detection light path 244.

In the process for determining the flow rate of the liquid, communicating, in fluid member 218, pre-analyte 221, analyte 222, photoanalyte 242 and combinations thereof, from optical interaction region 228 to photo interaction region 230 occurs directly through convection and diffusion of pre-analyte 221, analyte 222, photoanalyte 242 and combinations thereof, in liquid 220.

In the process for determining the flow rate of the liquid, subjecting photoanalyte 242 to analytical light 232 includes transmission of the analytical light 232 into the photo interaction region 230.

In the process for determining the flow rate of the liquid, communicating analytical light 232 through analytical light path 238 to photo interaction region 230 can include using a measurable and known intensity of analytical light 232 through the analytical light path 238 and into the photo interaction region 230. The analytical light 232 can be time changing or constant. Moreover, the intensity of analytical light 232 can be controlled, e.g., by an electronic power supply controlling the analytical light sources 240 or filters that only transmit a fraction of the light emitted by the analytical light sources 240.

In the process for determining the flow rate of the liquid, subjecting photoanalyte 242 to analytical light 232 includes absorption of a photon by photoanalyte 242, which can release a photon. In fluorescence, the emitted photon is red-shifted or has longer wavelength than analytical light 232. Alternatively, photoanalyte 242 can dissipate energy absorbed from analytical light 232 by a non-radiative process or can scatter analytical light 232.

In the process for determining the flow rate of the liquid, producing photoanalyte light 246 from photoanalyte 242, emission of fluorescent light from photoanalyte 242, in the event that analytical light 232 is absorbed by photoanalyte 242 includes producing an excited state and subsequently emitting light from the excited state.

In the process for determining the flow rate of the liquid, communicating photoanalyte light 246 from photo interaction region 230 to detection light path 244 includes transmitting photoanalyte light 246 to light detection path 244.

In the process for determining the flow rate of the liquid, communicating photoanalyte light 246 from photo interaction region 230 to photodetector 248 includes transmitting light along an optical path, such as a fiber optic cable inserted into the photoanalyte light path 244.

In the process for determining the flow rate of the liquid, detecting photoanalyte light 246 with photodetector 248 includes converting the photoanalytical light into a signal, e.g., an electrical signal, with a photodiode, spectrometer, or the like, and recording the intensity or wavelength of the photoanalytical light as a function of time.

In the process for determining the flow rate of the liquid, determining the flow rate of liquid 220 as a function of time includes measuring the time, intensity, or wavelength changes between activation of pre-analyte 221, analyte 222, or photoanalyte 242, and recording of photoanalytical light 246. The process can include estimating the arrival time or peak emission of the photoanalyte at the photo interaction region 230. The process can also include estimated adjustments for time delays associated with chemical processes or interactions with the analyte or photoanalyte with objects in the microchannel. The process can include measurements or mathematical calculations of the distance or volume of fluid between the optical interaction region 228 and the photo interaction region 230. Calculations can include, e.g., the microchannel size and shape, the activation light 226 and photoanalyte light 246, the flow rate of liquid 220, the physical properties of the pre-analyte 221, analyte 222, photoanalyte 242, or the liquid 220. The process can also include calibration of the measurements of volume and time to a known flow standard, such as a gravimetric flow meter. In such a way, a calibration factor can be determined to relate the measurements of the optical flow meter to a valid or traceable scale of volumetric flow rate.

In the process for determining the flow rate of the liquid, calibrating flow controller 250 from the calibration factor includes adjusting the input flow parameters, e.g. pressure or pump rate, in order to match the desired flow rate to the measured flow rate.

The process for measuring flow-rate can be extended to the case of multiple photo interaction regions 230. In this case, the measurement proceeds as described above but the calculation for each photo interaction region 230 is based on the dependencies described above.

Optical flow meter 200 has numerous advantageous and beneficial properties. The optical flow meter provides quantitative microscale chemical and biological measurement and can be integrated with sensors for synergistic function and performance. Moreover, the optical flow meter provides optofluidics that integrate optical fibers into microfluidic waveguides. Optical components transmit and collect light from substances in microflows such as fluorescent compounds. Components for splitting light into multiple paths, focusing light into the microchannel, and collecting fluorescence emission exclude excitation light as described below. An integrated system of the optical flow meter provides real-time and continuous flow-monitoring using caged fluorophores. The optical flow meter also probes dynamic fluid properties and measures samples using microfluidic cytometry.

The optical flow meter can be used for investigations in chemistry, biology, and physics because it provides unique fluid transport regimes, dynamic control of small fluid volumes (femtoliters to milliliters), and high-throughput analysis of materials in flow. Integration of on-chip optical components of the optical flow meter provides miniaturization, portability, and speed of sensitive and multimodal measurement capabilities. The optical flow meter includes optical sensing elements with microfluidics to accurately and reproducibly measure microflows and characterize optical properties of materials in flow using sensitive chemical and biological assays. The optical flow meter can be used for cytometry, drug delivery, and diagnostic assays. Further, the optical flow meter can perform rapid, high quality measurements in both industrial and distributed or point-of-use applications.

In an aspect, optical flow meter 200 determines a flow rate of analyte 222 that is from 0.1 nanoliter per minute (nL/min) to 1 milliliter per minute (mL/min), specifically from 1 nL/min to 100 µL/min, and more specifically from 1 nL/min to 10 µL/min. Moreover, optical flow meter 200 has the beneficial property in that the volumetric flow rate can be directly related to the dimensions of the microchannel, and that it can be precisely determined from calibration or modeling. Further, optical flow meter 200 has the advantage in that it is easy to integrate optical elements into the device using a coupling fluid or optical adhesive, and the performance of the system appears to be rather robust to variations in assembly. Optical flow meter 200 uses fluorescence in that the output photoanalyte light is a different wavelength than the analytical light, which straightforwardly separates, i.e., filters, it from analytical light. Also, optical flow meter 200 advantageously places the photoanalyte light path (e.g., alternate path 244B) on a different axis than the analytical light, the coupling of the analytical light entering the photoanalyte light path is reduced, increasing the signal to noise ratio. Also, optical flow meter 200 advantageously determines simultaneously optical properties of the analyte or photoanalyte using alternate photoanalyte light paths (e.g. 244B, 244C). Beneficially, the changing the distance between the optical activation region and the photo analytical zone can change the range of flow velocities and fluid (e.g., viscosity) or analyte properties (e.g., diffusion constant) where the flow meter performs and sets the precision for time-of-flight measurements of convection or diffusion of analyte or photoanalyte between the activation and measurement points.

Figure 10:
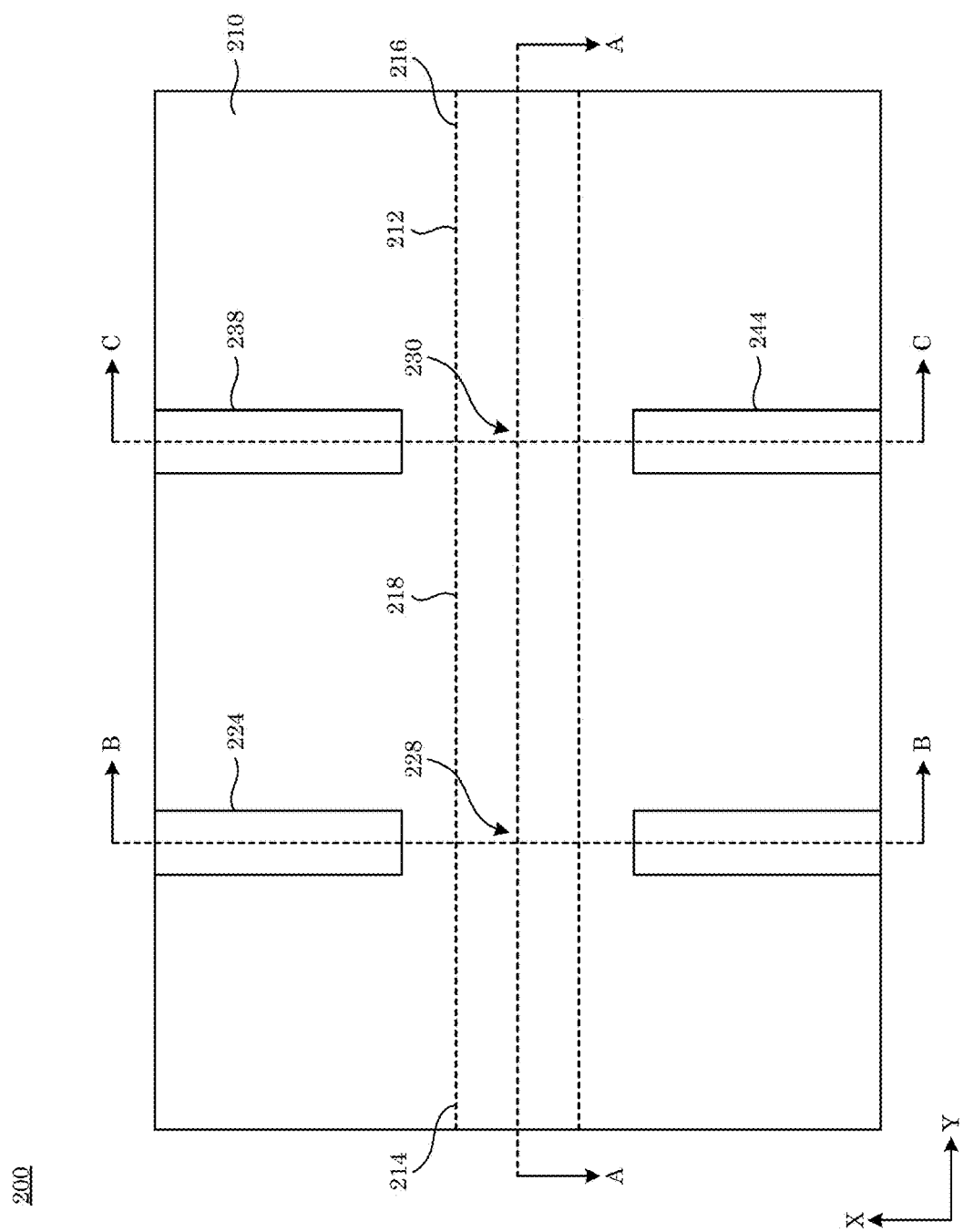
FIG. 10 shows a top view of the optical flow meter shown in FIG. 9.
Figure 11:
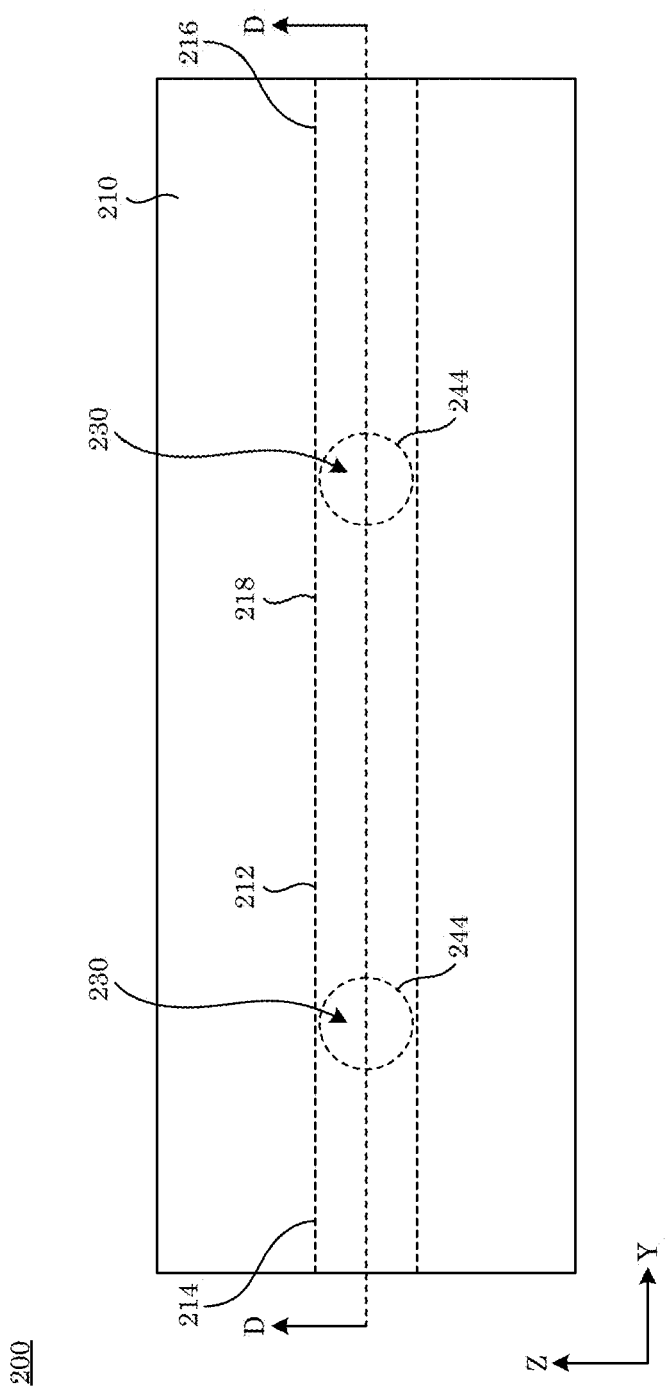
FIG. 11 shows a side view of the optical flow meter shown in FIG. 9.
Figure 12:
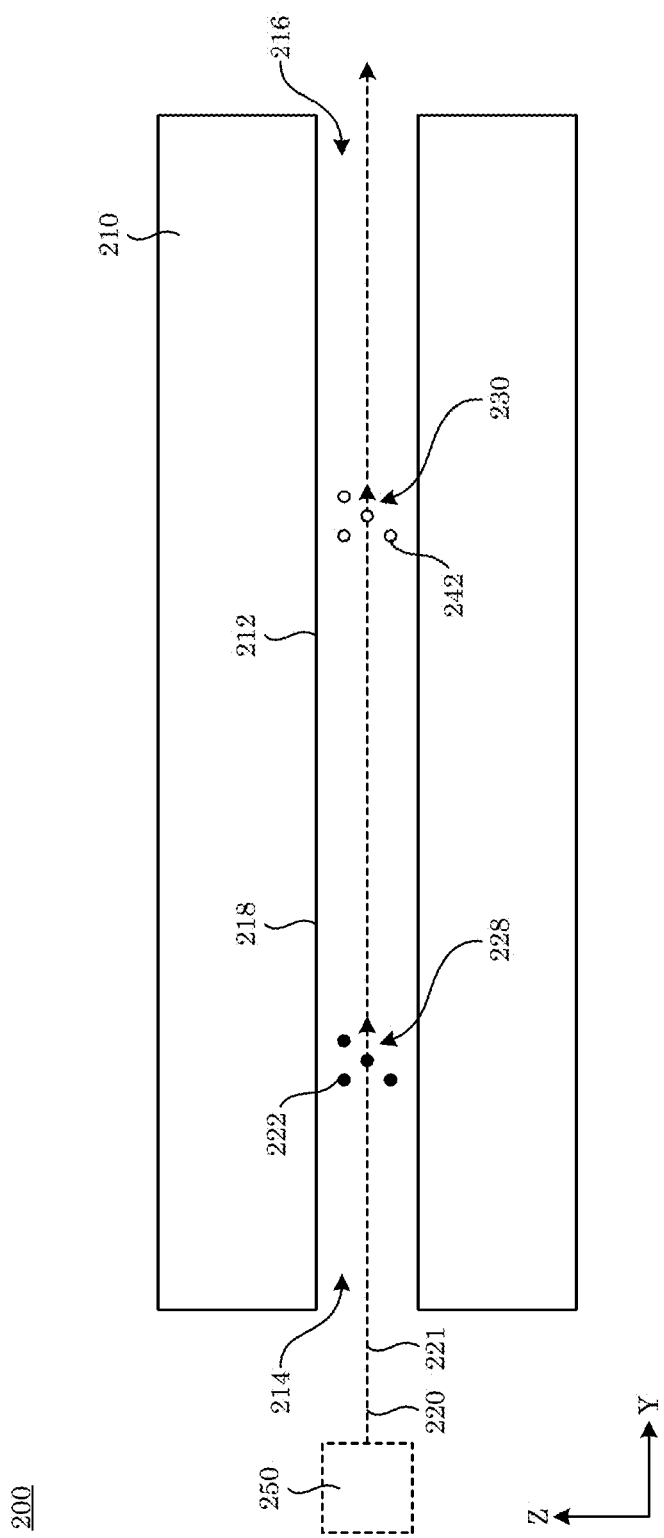
FIG. 12 shows a cross-section along line A-A of the optical flow meter shown in FIG. 10.
Figure 13:
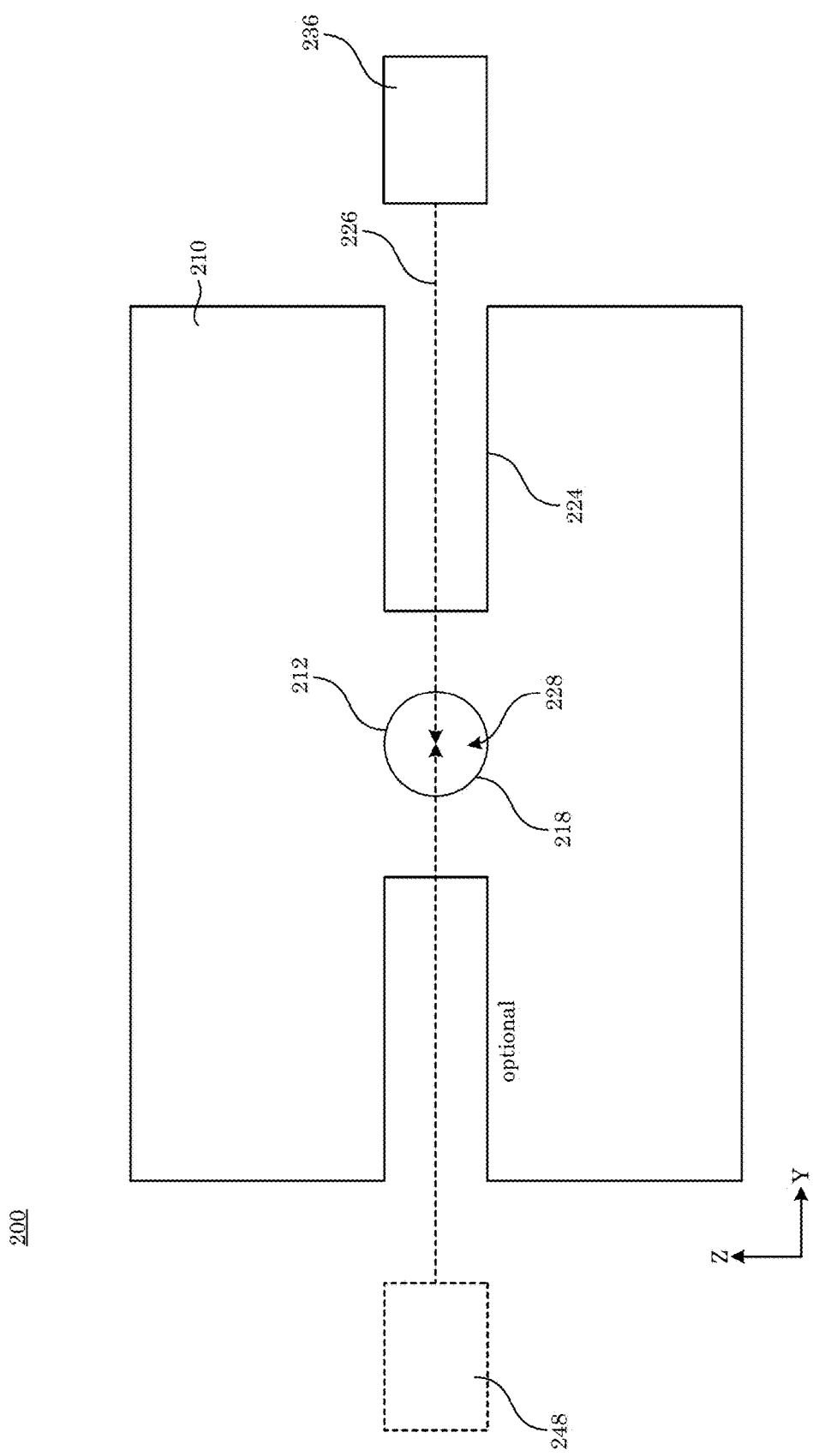
FIG. 13 shows a cross-section along line B-B of the optical flow meter shown in FIG. 10.

Optical flow meter 200 advantageously and unexpectedly tracks changes in the flow rate with the activation laser on continuously, e.g. not pulsed (see FIG. 10). Unexpectedly, optical flow meter 200 has a precision of scaling the flow rate with laser power that is not a strong function of the shape of the microchannel or the optical or photo interaction regions. Beneficially, the optical flowmeter does not require a microscope to achieve measurements of low flow rates or low uncertainties.

The articles and processes herein are illustrated further by the following Examples, which are non-limiting.

EXAMPLES

Example 1. Optical Flow Meter with a Waveguide Using Photobleaching

The optical flow meter measures convection or diffusion of an activated compound, e.g., a fluorescent marker, at a measurement point in a liquid flowing through a microchannel. FIG. 22, FIG. 23, FIG. 24, and FIG. 25 show optical flow meters in which fluorescent molecules (fluorescein) are stimulated with analytical (excitation) light, and emit photoanalyte light (fluorescence) that is collected by a photoanalyte light path (optical waveguide) and measured on a photodetector. At relatively high excitation laser power or a relatively low flow rate, the fluorescent molecules are photobleached, that is, they are destroyed by the light and no longer emit fluorescence. Thus, the flow meter provides measurement of the flow rate based on the fraction of how much fluorescence remains (relative to maximum, saturated, or calibrated emission at the highest or calibrated flow rate) for a particular flow rate and laser power. Laser power adjustments allow the sensitivity of flow rate to shift to different speeds, e.g. higher laser power enables measurement of faster flows, and lower laser power enables measurement of lower flows (for a given signal-to-noise ratio of fractional fluorescence).

The flow meter was made by first creating topographic features on silicon wafers using photolithography. For the optical flow meter, photolithography was conducted at the Center of Nanoscale Technology (CNST) at NIST. A negative photoresist made of a polymer (here, SU8) was used as a photosensitive polymer to produce topographic patterns on a silicon wafer. The features on the SU8 were approximately 125 micrometers tall. The features on the SU8 were treated with a silane for removal of substrates after casting. Devices were made of poly(dimethylsiloxane) (PDMS) after casting and curing against the topographic features. Two PDMS layers were bonded together to enclose a device containing open-ended microchannels and light paths. The light paths were filled with a UV-curable optical adhesive (commercially available as Norland Optical Adhesive 88) that had a higher index of refraction compared to PDMS. Cleaved optical fibers connected to light sources and power meters were inserted into light paths and then cured with UV light. Analytical light was supplied by an Omicron 488 nm laser with up to 60 mW output power. The power meter was a dual channel meter from Newport Corporation fitted with photodiode sensors having sensitivity in the 400 nm to 1100 nm wavelength range.

Figure 22:
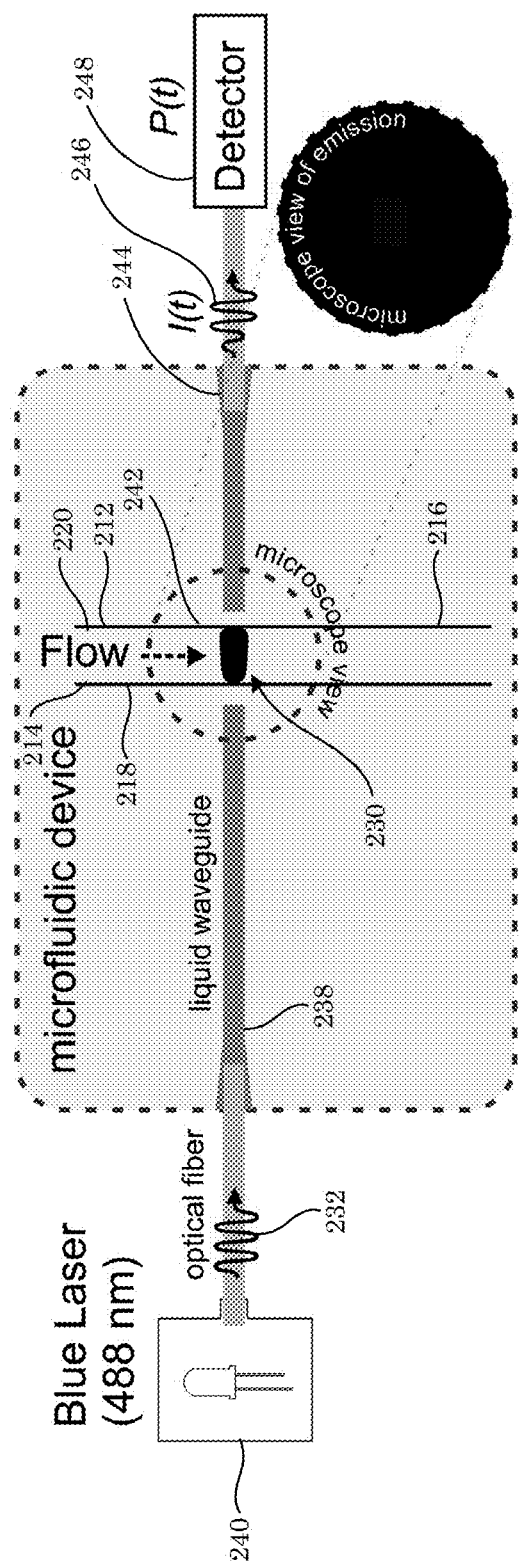
FIG. 22 shows an optical flow meter.
Figure 23:
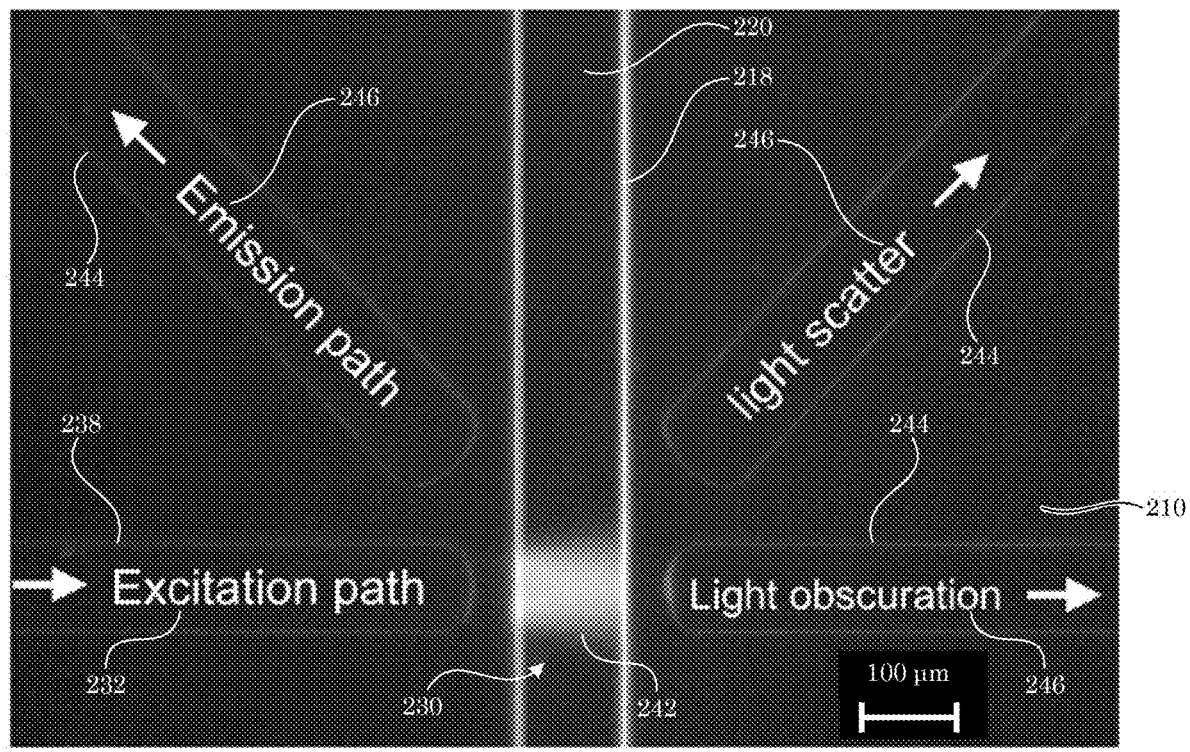
FIG. 23 shows an optical flow meter that includes a plurality of light collection paths.

An analyte (e.g., fluorescein) in a flow was excited when the analyte crossed an optical path that communicated analytical light absorbed by the analyte or that communicated fluorescence from the analyte. To determine changes in absorption (or obscuration) of analytical light, light was collected from the opposite side of the microchannel from the analytical light (as shown in FIG. 22). To determine changes in emitted or detected light, the light was collected at some angle relative to the analytical light on the same side of the microchannel as the analytical light (as shown in FIGS. 23 and 24). In addition, the amount of light scattered from the analyte can be collected in a waveguide on the opposite side of the microchannel as the analytical light but at a slight angle (as shown in FIG. 23). Light was collected in the optical paths and was delivered to a detector that was a power meter.

The waveguide collecting fluorescence emission was at a selected angle and selected distance from the source waveguide to maximize emitted light collection while reducing an amount of excitation light communicated to the detector. In this respect, with reference to FIG. 24, a microscope imaged 488 nm light impinging on a stream of fluorescein, which represents the area of measurement through which the activated molecule (fluorescein) passed. Fluorescein flowed down the central microfluidic channel and lit up when it crossed the excitation path, which was collected by the microscope as shown in the inset of FIGS. 22 and 24 and by the power meter(s). Fluorescence emission from the fluorescein can be collected via the emission path, and the excitation light can be excluded using optical filters. In this example, the optical filter was a bandpass filter than passed greater than 95% of light between 500 nm and 540 nm, which blocking greater than 99.99% of light outside of that range from reaching the power meter measuring fluorescence emission. This wavelength range was chosen because it maximizes transmission of the emitted fluorescence light from fluorescein while excluding the analytical light.

Figure 25:
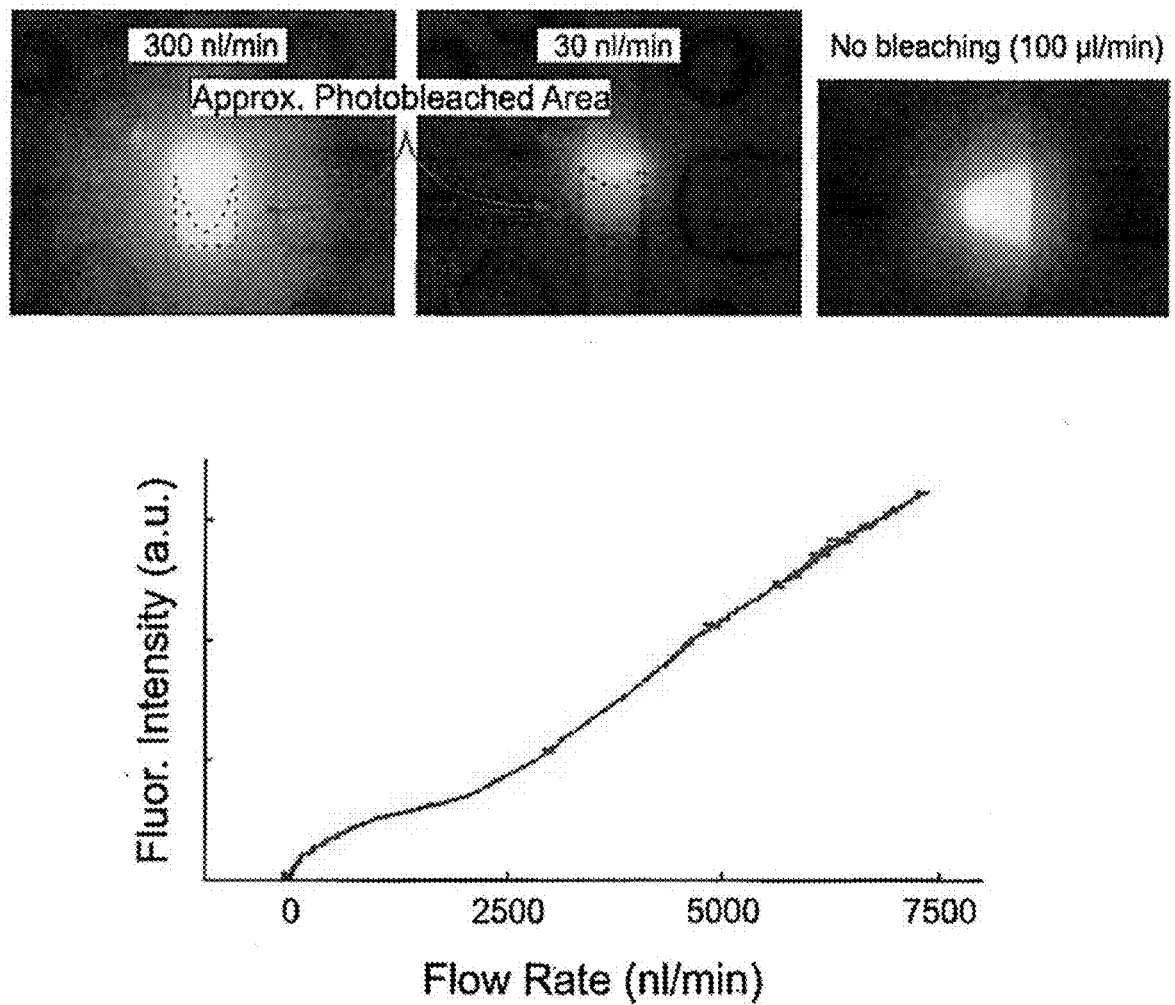
FIG. 25 shows an optical flow meter in which (upper left panel) an analyte has photobleaching under a moderate flow condition; (upper middle panel) an analyte has more photobleaching under a low flow condition; (upper right panel) an analyte has no photobleaching; and (lower panel) a graph of fluorescence intensity versus flow rate for emission of light by an analyte in the optical flow meter.

Advantageously, the optical flow meter measures the change in fluorescence emission with respect to a maximum, saturated, or calibrated fluorescence intensity as a function of flow rate (or in reference to a calibrated flow rate), as shown in FIG. 25. In FIG. 25, the calibrated flow rate was a commercial flow meter specified to have accuracy to within 350 nl/min (5% of full scale) over the range shown. Loss of fluorescence intensity (e.g. photobleaching) as a function of flow rate is demonstrated in the microscope images the top of FIG. 25. The upper panel of FIG. 25 shows a microscope view of the amount of fluorescence being emitted for a particular analytical light power as a function of flow rate. At slower flows, the photoanalyte spends more time in the interaction region and tends to be photobleached and no longer emits light. At very fast flow rates, there is no bleaching of the analyte and the full region of analytical light interacting with the analyte is visible. Fluorescent molecules on the sides of the channels are most likely to bleach first due to the no-slip boundary condition (e.g. zero velocity at the channel walls) in pressure driven flows. The lower panel shows a plot of measured photoanalyte light as a function of flow rate.

Figure 26:
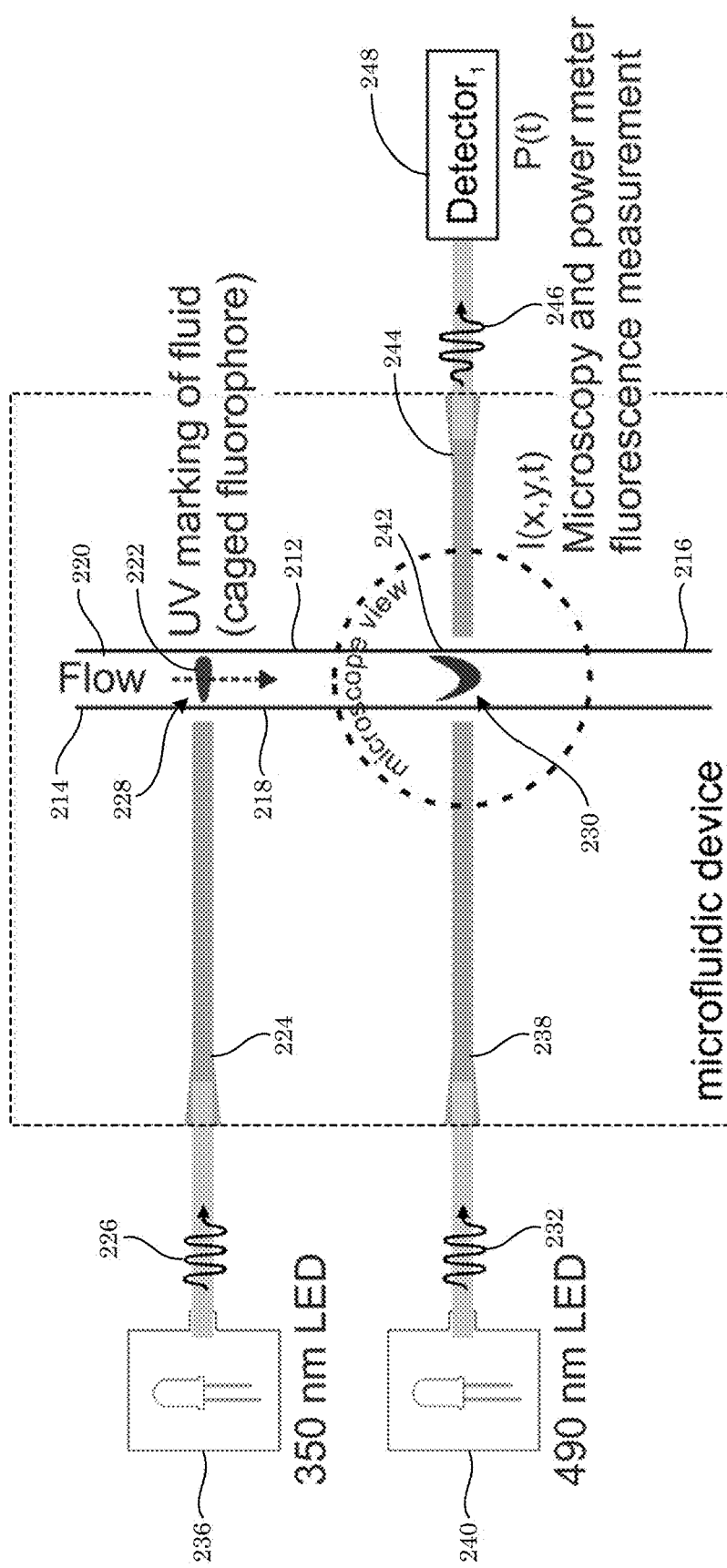
FIG. 26 shows an optical flow meter.
Figure 27:
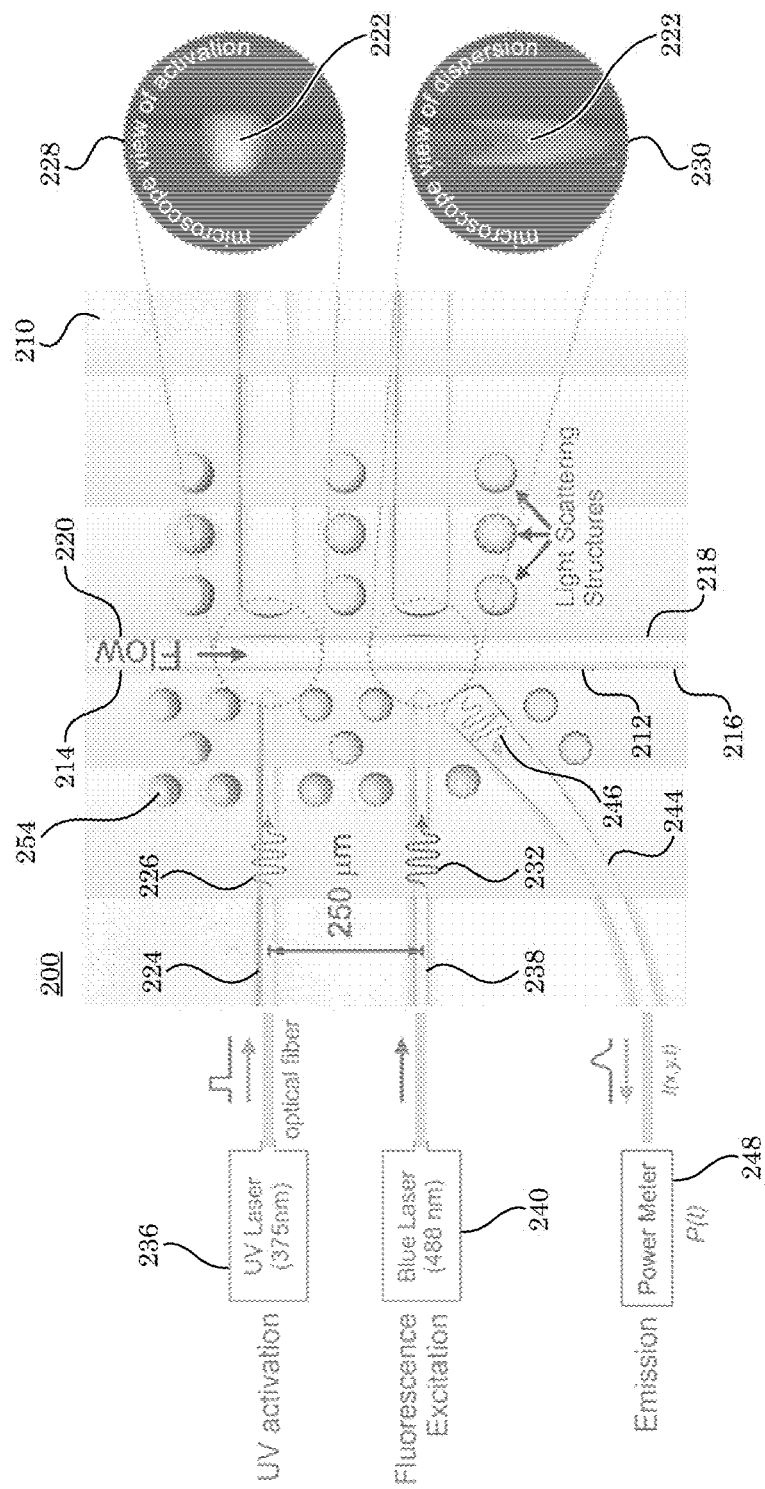
FIG. 27 shows an optical flowmeter.
Figure 32:
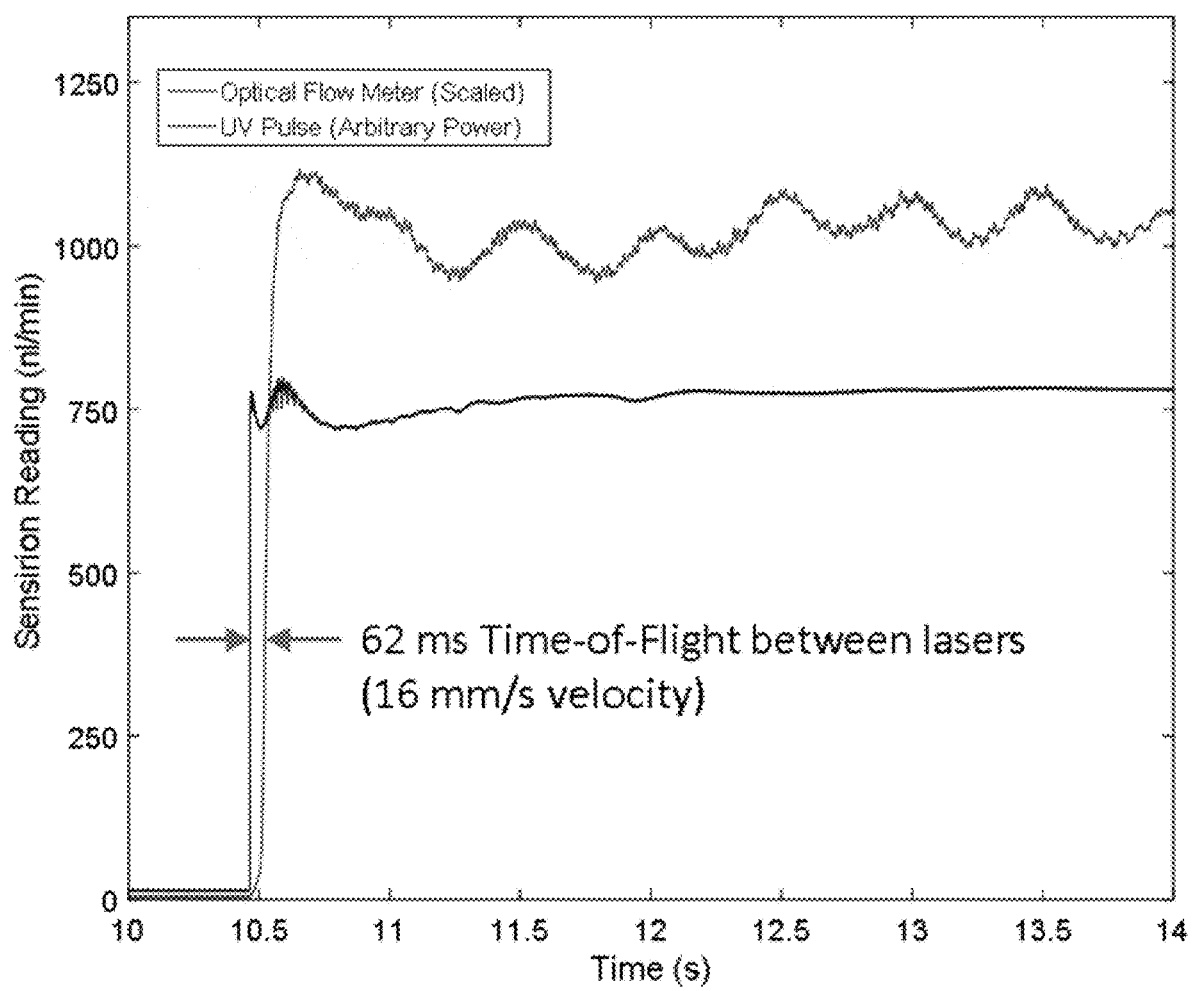
FIG. 32 shows a graph of flow rate versus time.

Example 2. Optical Flow Meter with Activation Light for Time-of-Flight Measurement of Flow Rate FIGS. 26 and 27 show optical flowmeters that use an activation light source and an analytical light source to measure flow rate using a time-of-flight principle. In this example, a non-fluorescent pre-analyte is activated, or converted to analyte, using an activation light at a particular position in a flow channel. The activation light is pulsed to produce a narrow band of contrast (e.g. fluorescent analyte) in the flow. At a measured distance (which corresponds to a known volume when channel cross section dimensions are known), the arrival of the now-fluorescently-excitable analyte as it crosses an analytical light path, and emits light, which is collected and transmitted to a detector. The fabrication method for the flow meter and measurement process for the analytical light occur in a similar manner as described in Example 1. In this example, photobleaching (corresponding to loss of measured intensity) is not a concern because the measurement is based on how long it takes for the analyte, once produced at the activation laser, to reach the analytical light. Photobleaching, as well as the amount of pre-analyte converted to analyte, can be utilized for changes in flow rate in real time if the activation laser is operated in continuous mode rather than in pulsed mode (see FIG. 32).

As in Example 1, optofluidic devices were prepared using photolithography and cast in poly(dimethylsiloxane) (PDMS) against SU8 features on silicon masters. Optical waveguides were filled with optical adhesive followed by insertion of optical fibers and UV curing. Fiber-coupled LEDs (350 nm and 490 nm wavelengths) from ThorLabs were used with a power meter to deliver and measure light, respectively. Liquid flow in the optical flow meter were controlled by a syringe pump (Harvard Apparatus Pico Plus Elite) and monitored in series with a commercial flow meter (Sensirion LG16-0150D). Flow within the optical flow meter was visualized with fluorescein (analyte) and CMNB-caged fluorescein (pre-analyte).

To focus light from the waveguides across the microchannel, lenses with approximately 50 µm radius of curvature (Rc) were placed on the ends of the waveguides for activation and analytical light paths. Lenses with 100 µm Rc were placed on the waveguides for detection light. The shape of the illumination, the width of contrast produced when the activation light pulse converted pre-analyte to analyte, and the shape of contrast as it flowed down the microchannel were imaged with a fluorescence microscope, as shown in FIG. 27.

Figure 28:
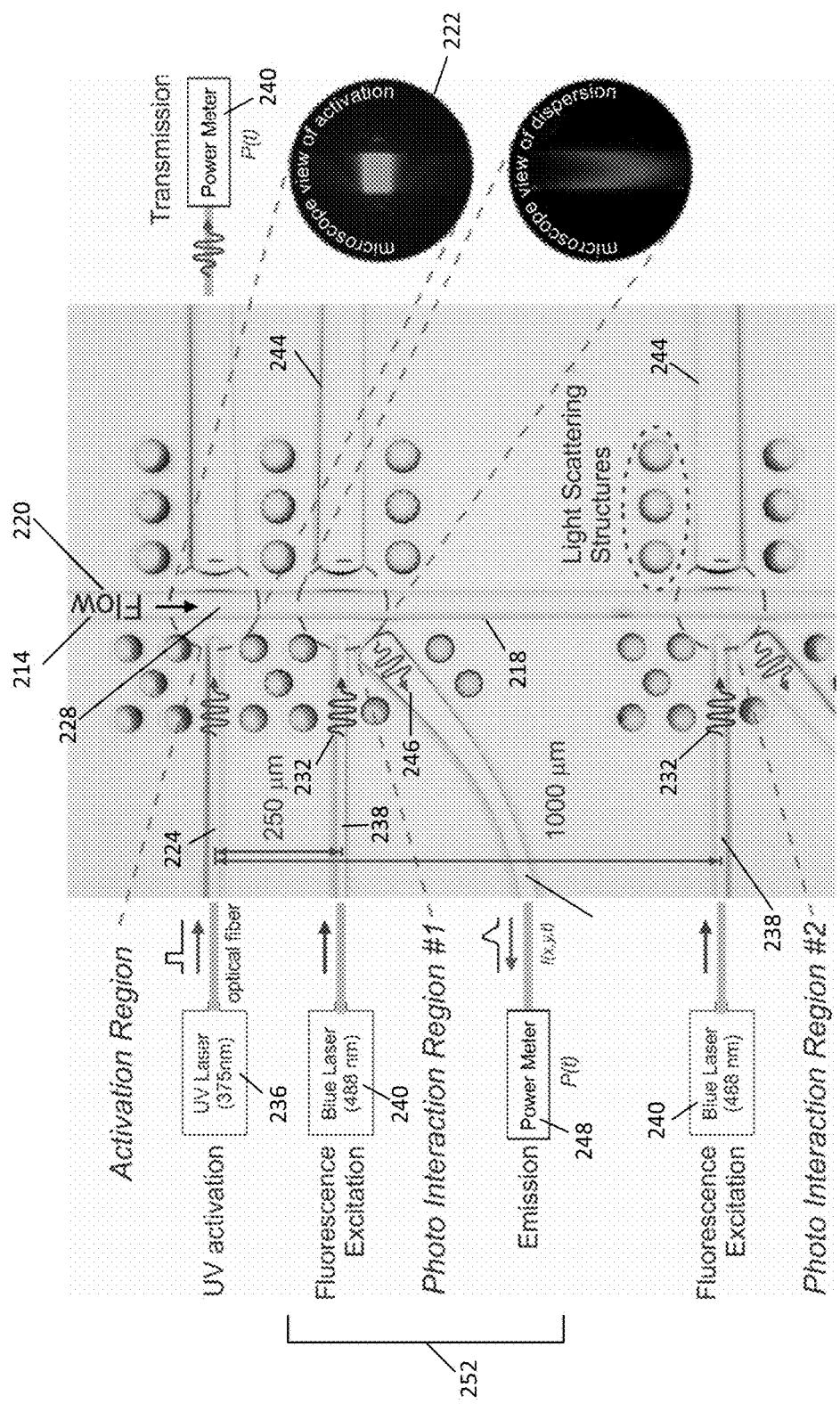
FIG. 28 shows an optical flow meter.

FIG. 28 shows an optical flowmeter with repeated optical elements that can measure the displacement of pre-analyte, analyte, or photoanalyte as flows occur down the channel. In such an embodiment, accuracy and knowledge of the time-dependent nature of the fluid flow is improved by repeated determination of the flow at multiple points along the channel. Repeated measurement elements also allow for observation of time-dependent changes in the photoanalyte, as was mentioned above.

Figure 29:
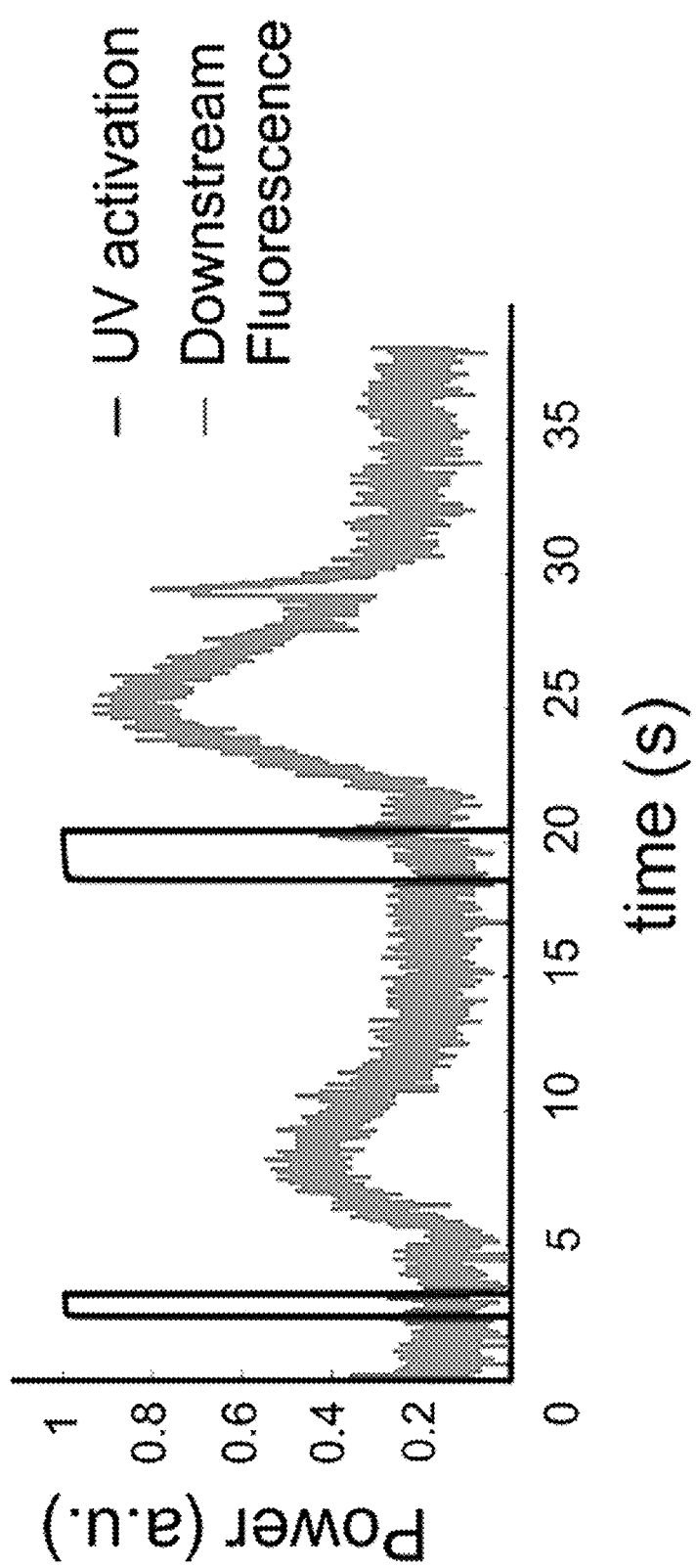
FIG. 29 shows a graph of optical power versus time for emission produced by a pulsed activation light.
Figure 30:
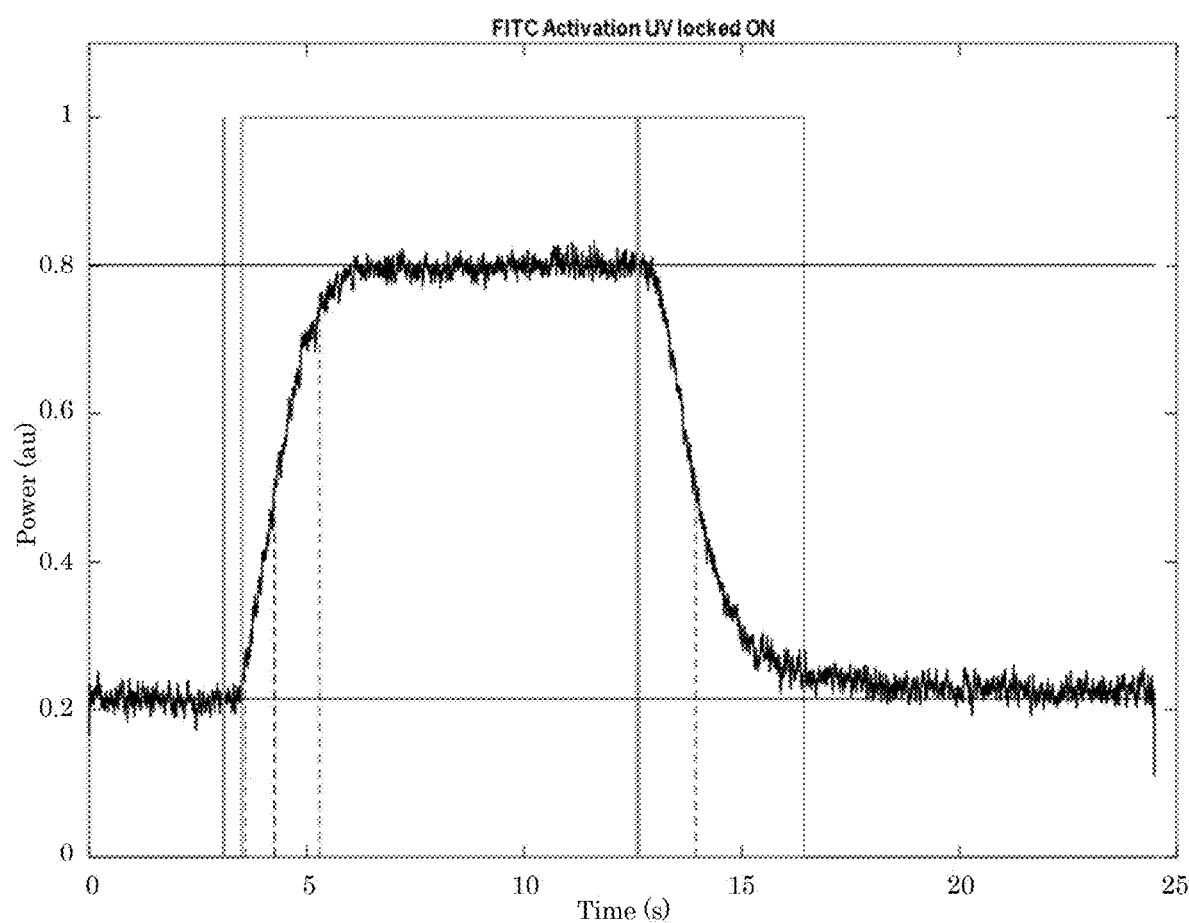
FIG. 30 shows a graph of optical power versus time for steady-state emission from a photoanalyte subjected to activation light.
Figure 31:
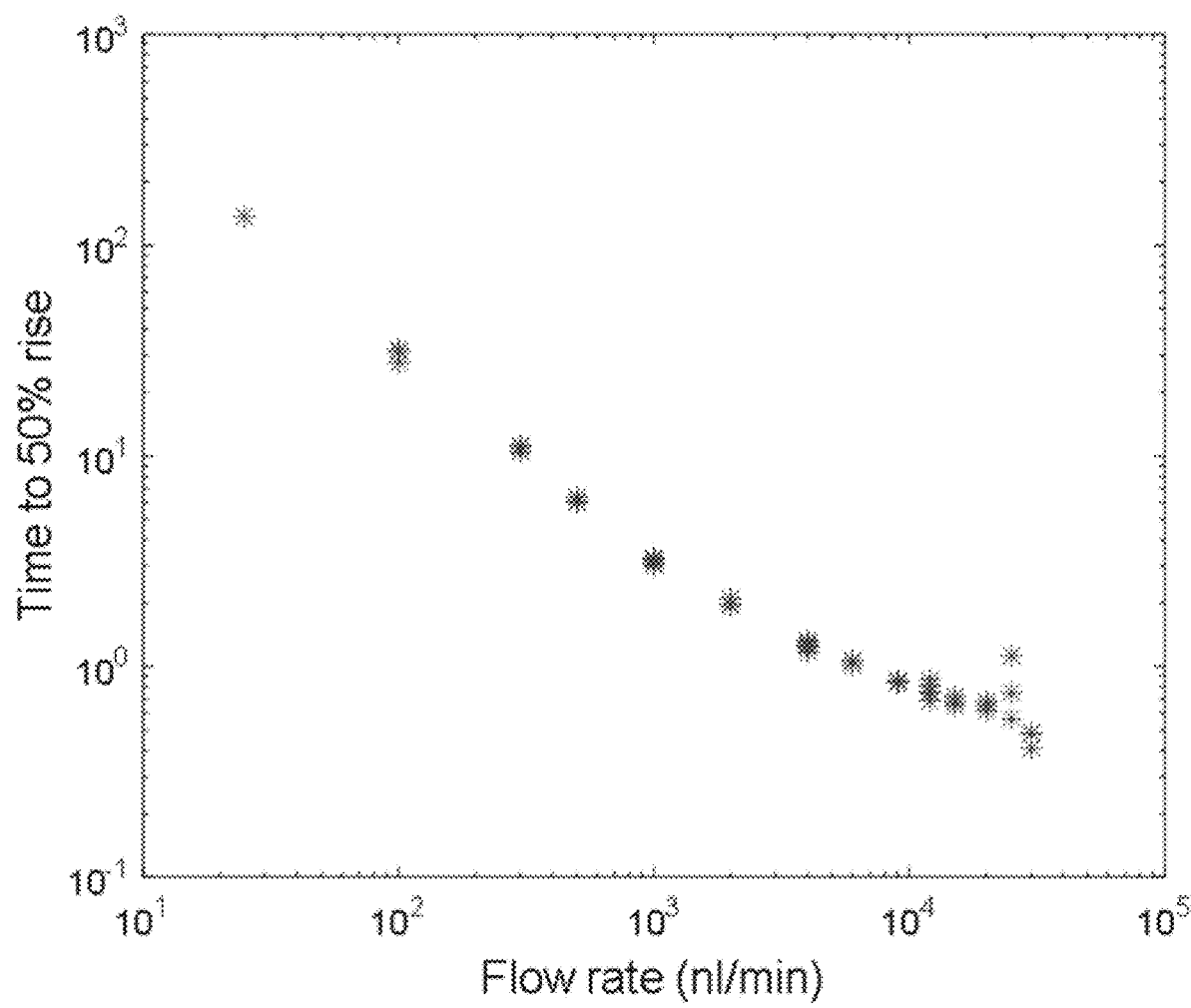
FIG. 31 shows a graph of time until a 50% rise in optical power versus flow rate.

FIG. 29, FIG. 30, and FIG. 31 show data acquired with the optical flow meter. In the optical flow meter, CMNB caged fluorescein in the flow was activated by crossing an activation region containing UV light. In FIG. 29, the two separate UV activation pulses (350 nm light) are shown followed by the corresponding arrival of the analyte as it arrived at the photo interaction region, as measured by emitted fluorescence on the photodetector. Fluorescence emission was excited and collected by a pair of waveguides at a fixed distance downstream. Under continuous operation of the activation light with stable flow, as shown in FIG. 30, the intensity of the emitted fluorescence reaches a steady state. The timing of the arrival of the fluorescence signal or other properties such as the time-to-half-maximum intensity can be used to calculate the flow rate given the timing of the activation pulse and the dimensions of the channel between the activation and analytical light paths, among other considerations. FIG. 29 shows how using the measurement of the time for the fluorescence to reach 50% of maximum (given a continuous or long exposure activation light such as in FIG. 30) is used to create a calibration of flow rates based on time-of-flight measurements of the analyte (fluorescein) after its creation from pre-analyte at the optical interaction region (activation zone). Measurements were reproducible with greater than 10% accuracy over approximately 3 orders of magnitude in flow, from 20 nL/min to about 20 µL/min. Additionally, as shown in FIG. 31, the optical flow meter can provide a continuous flow measurement when the activation light is continuous, but the flow is not stable. Changes in the flow rate, such as occurs in syringe pumps as the motor advances through individual steps, can be easily visualized in the fluorescence intensity measurements.

The optical flow meter efficiently delivers and collects light across a microfluidic channel and can also be used to measure dynamic fluid properties and to characterize particles and cells in microfluidic cytometry as they flow past activation and analytical light paths.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:

1. An optical flow meter that determines a flow rate of a liquid and comprising:
   a substrate;
   a microchannel disposed in the substrate comprising:
      a fluid receiver that receives a liquid comprising an analyte;
      a fluid transmitter that receives the liquid from the fluid receiver; and
      a fluid member interposed between the fluid receiver and fluid transmitter and that:
         comprises:
            an optical interaction region and that receives activation light; and
            a photo interaction region and that:
               receives analytical light; and
               communicates photoanalyte light out of the fluid member;
         is bounded by the substrate; and
         communicates the liquid from the fluid receiver to the fluid transmitter;
   an analytical light path disposed in the substrate, arranged at an oblique angle or right angle to the fluid member proximate to the photo interaction region, and that:
      receives the analytical light from an analytical light source; and
      communicates the analytical light to the photo interaction region,
      such that the analytical light:
         interacts with the analyte in the photo interaction region subsequent to the interaction of the analyte with the activation light in the optical interaction region; and
         produces a photoanalyte from the analyte in response to interaction of the analyte with the analytical light in the photo interaction region,
      the photoanalyte producing photoanalyte light; and
   a detection light path disposed in the substrate, arranged at an oblique angle or right angle to the fluid member proximate to the photo interaction region, arranged on a same side of the fluid member as the analytical light path, and that:
      receives the photoanalyte light from the photo interaction region;
      communicates the photoanalyte light from the microchannel to a photodetector, the optical flow meter determines a flow rate of the analyte in the liquid; and
      maximizes collection of emitted or scattered light from the photoanalyte while minimizing an amount of analytical light collected into the detection light path.

2. The optical flow meter of claim 1, further comprising:
   an activation light path disposed in the substrate, arranged at an oblique angle or right angle to the fluid member proximate to the optical interaction region, and that:
      receives activation light from an activation light source; and
      communicates the activation light to the optical interaction region,
   such that the activation light interacts with the analyte in the optical interaction region.

3. The optical flow meter of claim 1, further comprising a flow controller that provides the liquid to the fluid receiver.

4. The optical flow meter of claim 2, further comprising the activation light source in optical communication with the activation light path and that provides the activation light to the activation light path.

5. The optical flow meter of claim 1, further comprising the analytical light source in optical communication with the analytical light path and that provides the analytical light to the analytical light path.

6. The optical flow meter of claim 1, further comprising the photodetector in optical communication with the detection light path and that receives the photoanalyte light from the detection light path.

7. The optical flow meter of claim 1, further comprising the analytical light source in optical communication with the analytical light path and that provides the analytical light to the analytical light path.

8. The optical flow meter of claim 2, wherein the activation light path comprises a waveguide.

9. The optical flow meter of claim 1, wherein the analytical light path comprises a waveguide.

10. The optical flow meter of claim 1, wherein the detection light path comprises a waveguide.

11. The optical flow meter of claim 1, wherein the photoanalyte light comprises emitted light, scattered light, transmitted light, or a combination comprising at least one of the foregoing types of light.

12. The optical flow meter of claim 1, wherein the detection light path comprises an emission waveguide, a scattered light waveguide, a light obscuration waveguide, or a combination comprising at least one of the foregoing types of light paths.

13. The optical flow meter of claim 1, wherein a plurality of photo interaction regions, a plurality of analytical light paths, and a plurality of detection light paths are disposed on the substrate,
   wherein the optical interaction region is interposed between the fluid receiver and the photo interaction regions.

14. A process for determining a flow rate of a liquid, with the optical flow meter of claim 1, the process comprising:
   flowing the liquid comprising an analyte through the microchannel;
   communicating, in the fluid member, the analyte to the photo interaction region;
   communicating analytical light through the analytical light path to the photo interaction region, wherein the photo interaction region is a portion of the microchannel that receives the analytical light and where the analytical light interacts with the analyte;
   subjecting the activated analyte to the analytical light;
   producing a photoanalyte from the activated analyte in response to subjecting the analyte to the analytical light;
   producing photoanalyte light from the photoanalyte;
   communicating the photoanalyte light from the photo interaction region to the detection light path to determine the flow rate of the liquid.

15. The process for determining the flow rate of the liquid of claim 14, further comprising:

detecting the photoanalyte light with the photodetector; and determining a flow rate of the liquid as a function of time.

16. The process for determining the flow rate of the liquid of claim 14, further comprising determining a calibration factor from the flow rate of the liquid as the function of time.

17. The process for determining the flow rate of the liquid of claim 16, further comprising calibrating a flow controller from the calibration factor.

18. A process for determining a flow rate of a liquid, with the optical flow meter of claim 2, the process comprising:
    flowing the liquid comprising an analyte through the microchannel;
    communicating activation light through the activation light path to the optical interaction region;
    subjecting the pre-analyte to the activation light;
    exciting the pre-analyte with the activation light to produce analyte;
    communicating, in the fluid member, the analyte from the optical interaction region to the photo interaction region, wherein the photo interaction region is a portion of the microchannel that receives the analytical light and where the analytical light interacts with the analyte;
    communicating analytical light through the analytical light path to the photo interaction region;
    subjecting the activated analyte to the analytical light;
    producing a photoanalyte from the activated analyte in response to subjecting the analyte to the analytical light;
    producing photoanalyte light from the photoanalyte;
    communicating the photoanalyte light from the photo interaction region to the detection light path to determine the flow rate of the liquid.

19. The process for determining the flow rate of the liquid of claim 18, further comprising communicating the photoanalyte light from the photo interaction region to a photodetector.

20. The process for determining the flow rate of the liquid of claim 19, further comprising:
    detecting the photoanalyte light with the photodetector; and
    determining a flow rate of the liquid as a function of time.

21. The process for determining the flow rate of the liquid of claim 19, further comprising determining a calibration factor from the flow rate of the liquid as the function of time.

22. The process for determining the flow rate of the liquid of claim 21, further comprising calibrating a flow controller from the calibration factor.

23. The process for determining the flow rate of the liquid of 22, further comprising calibrating a flow controller from the calibration factor.

* * * * *